(12) United States Patent
Lesso et al.

(10) Patent No.: US 11,722,057 B2
(45) Date of Patent: *Aug. 8, 2023

(54) CHARGE PUMP CIRCUIT

(71) Applicant: Cirrus Logic International Semiconductor Ltd., Edinburgh (GB)

(72) Inventors: John P. Lesso, Edinburgh (GB); Peter J. Frith, Edinburgh (GB); John L. Pennock, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/494,424

(22) Filed: Oct. 5, 2021

(65) Prior Publication Data

US 2022/0029532 A1    Jan. 27, 2022

Related U.S. Application Data

(63) Continuation of application No. 16/427,892, filed on May 31, 2019, now Pat. No. 11,146,171, which is a (Continued)

(30) Foreign Application Priority Data

Dec. 23, 2010 (GB) ...................................... 1021801

(51) Int. Cl.
*H02M 3/07* (2006.01)
*H03G 3/30* (2006.01)

(52) U.S. Cl.
CPC ................ *H02M 3/07* (2013.01); *H03G 3/30* (2013.01); *H02M 3/071* (2021.05); *H02M 3/072* (2021.05)

(58) Field of Classification Search
CPC .... H02M 3/07; H02M 3/07; H02M 2003/072; H02M 3/073; H02M 3/1582;
(Continued)

(56) References Cited

U.S. PATENT DOCUMENTS

| | | | |
|---|---|---|---|
| 4,451,743 | A | 5/1984 | Suzuki et al. |
| 5,532,916 | A | 7/1996 | Tamagawa |

(Continued)

FOREIGN PATENT DOCUMENTS

| | | |
|---|---|---|
| EP | 0 585 925 A2 | 9/1993 |
| EP | 0 862 260 A2 | 3/1998 |

(Continued)

*Primary Examiner* — Hai L Nguyen
(74) *Attorney, Agent, or Firm* — Blank Rome LLP

(57) ABSTRACT

A bipolar output charge pump circuit having a network of switching paths for selectively connecting an input node and a reference node for connection to an input voltage, a first pair of output nodes, two pairs of flying capacitor nodes, and a controller for controlling the switching of the network of switching paths. The controller is operable to control the network of switching paths when in use with two flying capacitors connected to the two pairs of flying capacitor nodes, to provide a first mode and a second mode when in use with two flying capacitors connected to the flying capacitor nodes, wherein at least the first mode corresponds to a bipolar output voltage of +/−3VV, +/−VV/5 or +/−VV/6.

20 Claims, 36 Drawing Sheets

Related U.S. Application Data continuation of application No. 15/628,021, filed on Jun. 20, 2017, now Pat. No. 10,312,802, which is a continuation of application No. 14/822,559, filed on Aug. 10, 2015, now Pat. No. 9,735,672, which is a continuation of application No. 13/336,835, filed on Dec. 23, 2011, now Pat. No. 9,136,755.

(60) Provisional application No. 61/427,434, filed on Dec. 27, 2010.

(58) Field of Classification Search
CPC ..... H02M 2003/071; H02M 2003/077; H02M 3/137; H02M 3/157; H02M 2003/072; H02M 3/073; H02M 3/1582; H02M 2003/071; H02M 2003/077; H02M 2001/0041
See application file for complete search history.

(56) References Cited

U.S. PATENT DOCUMENTS

| | | |
|---|---|---|
| 5,623,222 A | 4/1997 | Tamagawa |
| 7,622,984 B2 | 11/2009 | Lesso |
| 8,710,910 B2 | 4/2014 | Wang |
| 8,890,604 B2 | 11/2014 | Lesso et al. |
| 9,136,755 B2 | 9/2015 | Lesso |
| 9,685,856 B2 | 6/2017 | Lesso |
| 9,735,672 B2 | 8/2017 | Lesso |
| 10,312,802 B2 * | 6/2019 | Lesso ................. H03G 3/30 |
| 11,146,171 B2 * | 10/2021 | Lesso ................. H03G 3/30 |
| 2007/0236972 A1 | 10/2007 | Imanaka |
| 2008/0150620 A1 | 6/2008 | Lesso |
| 2008/0159567 A1 | 7/2008 | Lesso et al. |
| 2009/0027109 A1 | 1/2009 | Tseng et al. |
| 2009/0326624 A1 | 12/2009 | Melse |

FOREIGN PATENT DOCUMENTS

| | | |
|---|---|---|
| EP | 2 309 629 A1 | 4/2011 |
| EP | 2 309 630 A2 | 4/2011 |
| EP | 2 309 630 B1 | 4/2021 |
| GB | 2 444 985 A | 6/2008 |
| GB | 2 448 905 A | 11/2008 |
| JP | 06 165482 | 6/1994 |
| WO | WO 2009/074779 A1 | 6/2009 |

* cited by examiner

| 4  | S2AVV | S2AVP | S2AVG | S2BVP | S2BVG | S2BVN | S1AVV | S1B2A | S1BVG | S1A2A |
|----|-------|-------|-------|-------|-------|-------|-------|-------|-------|-------|
| PA | 0     | 0     | 0     | 1     | 0     | 0     | 1     | 1     | 0     | 0     |
| PB | 0     | 0     | 0     | 1     | 0     | 0     | 0     | 0     | 1     | 1     |
| PP | 0     | 1     | 0     | 0     | 1     | 0     | 0     | 0     | 0     | 0     |
| PN | 0     | 0     | 1     | 0     | 0     | 1     | 0     | 0     | 0     | 0     |

Figure 4b

|   | Ph1 | Ph2 | Ph3 | Ph4 | Ph5 | Ph6 | Note             |
|---|-----|-----|-----|-----|-----|-----|------------------|
| a | PA  | PB  | PP  | PN  |     |     | 4-phase          |
| b | PA  | PB  | PN  | PA  | PB  | PP  | 6-phase          |
| c | PA  | PB  | (*) |     |     |     | Adaptive 3-phase |

(*) PP or PN according to detected droop

Figure 4c

| 3 | S2AVV | S2AVP | S2AVG | S2BVP | S2BVG | S2BVN | S1AVV | S1B2A | S1BVG | S1A2A |
|---|---|---|---|---|---|---|---|---|---|---|
| PA | 0 | 0 | 0 | 1 | 0 | 0 | 1 | 1 | 0 | 0 |
| PP1a | 0 | 1 | 0 | 0 | 1 | 0 | 0 | 0 | 1 | 1 |
| PN | 0 | 0 | 1 | 0 | 0 | 1 | 0 | 0 | 0 | 0 |

Figure 5b

| | Ph1 | Ph2 | Ph3 | Ph4 | Ph5 | Ph6 | Note |
|---|---|---|---|---|---|---|---|
| a | PA | PP1a | PN | | | | 3-phase |
| b | PA | PP1a | PA | PN | | | 4-phase |
| c | PA | (*) | | | | | Adaptive 2-phase |

(*) PP1a or PN or remain in PA according to detected droop

Figure 5c

| 2 | S2AVV | S2AVP | S2AVG | S2BVP | S2BVG | S2BVN | S1AVV | S1B2A | S1BVG | S1A2A |
|---|---|---|---|---|---|---|---|---|---|---|
| PD | 1 | 0 | 0 | 1 | 0 | 0 | 0 | 0 | 0 | 0 |
| PP | 0 | 1 | 0 | 0 | 1 | 0 | 0 | 0 | 0 | 0 |
| PN | 0 | 0 | 1 | 0 | 0 | 1 | 0 | 0 | 0 | 0 |

| | Ph1 | Ph2 | Ph3 | Ph4 | Ph5 | Ph6 | Note |
|---|---|---|---|---|---|---|---|
| a | PD | PP | PN | | | | 3-phase |
| b | PD | PP | PD | PN | | | 4-phase |
| c | PD | (*) | | | | | Adaptive 2-phase |

(*) PP or PN or remain in PD according to detected droop

| 1 | S2AVV | S2AVP | S2AVG | S2BVP | S2BVG | S2BVN | S1AVV | S1B2A | S1BVG | S1A2A |
|---|---|---|---|---|---|---|---|---|---|---|
| PE | 1 | 1 | 0 | 0 | 1 | 0 | 0 | 0 | 0 | 0 |
| PN | 0 | 0 | 1 | 0 | 0 | 1 | 0 | 0 | 0 | 0 |

| S | S2AVV | S2AVP | S2AVG | S2BVP | S2BVG | S2BVN | S1AVV | S1B2A | S1BVG | S1A2A | S1AVG | S1BVN | S1AVP |
|---|---|---|---|---|---|---|---|---|---|---|---|---|---|
| PA | 0 | 0 | 0 | 1 | 0 | 0 | 1 | 1 | 0 | 0 | 0 | 0 | 0 |
| PF | 0 | 0 | 0 | 1 | 0 | 0 | 0 | 0 | 0 | 1 | 0 | 1 | 0 |
| PP | 0 | 1 | 0 | 0 | 1 | 0 | 0 | 0 | 0 | 0 | 0 | 0 | 0 |
| PN | 0 | 0 | 1 | 0 | 0 | 1 | 0 | 0 | 0 | 0 | 0 | 0 | 0 |

| 2X | S2AVV | S2AVP | S2AVG | S2BVP | S2BVG | S2BVN | S1AVV | S1B2A | S1BVG | S1A2A | S1AVG | S1BVN | S1AVP |
|---|---|---|---|---|---|---|---|---|---|---|---|---|---|
| PG | 1 | 0 | 0 | 0 | 1 | 0 | 1 | 0 | 1 | 0 | 0 | 0 | 0 |
| PH | 0 | 0 | 0 | 0 | 1 | 0 | 0 | 1 | 0 | 0 | 0 | 0 | 1 |
| PJ | 0 | 0 | 0 | 0 | 0 | 1 | 0 | 1 | 0 | 0 | 1 | 0 | 0 |

| 4a | S2AVV | S2AVP | S2AVG | S2BVP | S2BVG | S2BVN | S1AVV | S1B2A | S1BVG | S1A2A | S1AVG | S1BVN | S1AVP |
|----|-------|-------|-------|-------|-------|-------|-------|-------|-------|-------|-------|-------|-------|
| PA | 0 | 0 | 0 | 1 | 0 | 0 | 1 | 1 | 0 | 0 | 0 | 0 | 0 |
| PB | 0 | 0 | 0 | 1 | 0 | 0 | 0 | 1 | 1 | 0 | 0 | 1 | 1 |
| PK | 0 | 0 | 0 | 0 | 1 | 0 | 0 | 0 | 0 | 1 | 0 | 0 | 0 |
| PP | 0 | 1 | 0 | 0 | 0 | 0 | 0 | 0 | 0 | 0 | 0 | 0 | 0 |
| PN | 0 | 0 | 1 | 0 | 0 | 1 | 0 | 0 | 0 | 0 | 0 | 0 | 0 |

Figure 11c

| | Ph1 | Ph2 | Ph3 | Ph4 | Ph5 | Ph6 | Note |
|---|-----|-----|-----|-----|-----|-----|------|
| a | PA | PB | PP | PN | PK |    | 5-phase |
| b | PA | PB | PN | PA | PP | PK | 6-phase |
| c | PA | PB | (*) | (*) |    |    | Adaptive 3-phase |
| c | PA | PB | (*) | (*) |    |    | Adaptive 4-phase |

(*) PP or PN or PP+PK or PN+PK or PK or remain in PB according to detected droop

| 2a | S2AVV | S2AVP | S2AVG | S2BVP | S2BVG | S2BVN | S1AVV | S1B2A | S1BVG | S1A2A | S1AVG | S1BVN | S1AVP |
|---|---|---|---|---|---|---|---|---|---|---|---|---|---|
| PD | 1 | 0 | 0 | 0 | 0 | 0 | 0 | 0 | 0 | 0 | 0 | 0 | 0 |
| PP | 0 | 1 | 0 | 0 | 0 | 0 | 0 | 0 | 0 | 0 | 0 | 0 | 0 |
| PN | 0 | 0 | 1 | 0 | 0 | 0 | 1 | 0 | 1 | 0 | 0 | 0 | 0 |
| PL | 0 | 0 | 0 | 1 | 0 | 1 | 0 | 0 | 0 | 0 | 0 | 0 | 0 |
| PK | 0 | 0 | 0 | 0 | 0 | 0 | 0 | 0 | 0 | 0 | 0 | 1 | 1 |

Figure 12b

| | Ph1 | Ph2 | Ph3 | Ph4 | Ph5 | Ph6 | Note |
|---|---|---|---|---|---|---|---|
| a | PD | PN | PP | PL | PK | | 5-phase |
| b | PD+PL | PN+PK | PP+PK | | | | 3-phase |
| c | PD+PL | PN+PK | PD+PL | PP+PK | | | 4-phase |
| d | PD+PL | (*) | | | | | 2-phase adaptive |

(*) PN+PK or PP+PK or remain at PD+PL according to detected droop

| 3a | S2AVV | S2AVP | S2AVG | S2BVP | S2BVG | S2BVN | S1AVV | S1B2A | S1BVG | S1A2A | S1AVG | S1BVN | S1AVP |
|---|---|---|---|---|---|---|---|---|---|---|---|---|---|
| PA | 0 | 0 | 0 | 1 | 0 | 0 | 1 | 1 | 0 | 0 | 0 | 0 | 0 |
| PP1 | 0 | 1 | 0 | 0 | 1 | 0 | 0 | 0 | 1 | 0 | 0 | 0 | 1 |
| PN1 | 0 | 0 | 1 | 0 | 0 | 1 | 0 | 0 | 0 | 0 | 1 | 1 | 0 |

Figure 13b

| P1a | S2AVV | S2AVP | S2AVG | S2BVP | S2BVG | S2BVN | S1AVV | S1B2A | S1BVG | S1A2A | S1AVG | S1BVN | S1AVP |
|---|---|---|---|---|---|---|---|---|---|---|---|---|---|
| PE  | 1 | 1 | 0 | 0 | 0 | 0 | 0 | 0 | 0 | 0 | 0 | 0 | 0 |
| PN  | 0 | 0 | 1 | 0 | 0 | 1 | 0 | 0 | 0 | 0 | 0 | 0 | 0 |
| P1E | 0 | 0 | 0 | 0 | 0 | 0 | 1 | 0 | 0 | 1 | 1 | 0 | 1 |
| P1N | 0 | 0 | 0 | 0 | 0 | 0 | 0 | 0 | 0 | 0 | 0 | 1 | 0 |

Figure 14b

|   | Ph1 | Ph2 | Ph3 | Ph4 | Note |
|---|---|---|---|---|---|
| a | PE | PN | PE1 | P1N | 4-phase |
| b | PE+PE1 | PN+P1N | | | 2-phase |
| c | PE+P1N | PN+PE1 | | | 2-phase |

Figure 14c

| 3X | S2AVV | S2AVP | S2AVG | S2BVP | S2BVG | S2BVN | S1AVV | S1B2A | S1BVG | S1A2A | S1AVG | S1BVN | S1AVP | S1BVV |
|---|---|---|---|---|---|---|---|---|---|---|---|---|---|---|
| PG | 1 | 0 | 0 | 0 | 1 | 0 | 1 | 0 | 1 | 0 | 0 | 0 | 0 | 0 |
| PH | 0 | 0 | 0 | 0 | 1 | 0 | 0 | 1 | 0 | 0 | 0 | 0 | 1 | 0 |
| PJ | 0 | 0 | 0 | 0 | 0 | 1 | 0 | 1 | 0 | 0 | 1 | 0 | 0 | 0 |
| PV | 0 | 0 | 0 | 0 | 1 | 0 | 0 | 0 | 0 | 1 | 0 | 0 | 0 | 1 |

| 6 | S2AVV | S2AVP | S2AVG | S2BVP | S2BVG | S2BVN | S1AVV | S1B2A | S1BVG | S1A2A | S1AVG | S1BVN | S1AVP | S1B2B | S2AVN |
|---|---|---|---|---|---|---|---|---|---|---|---|---|---|---|---|
| PA | 0 | 0 | 0 | 1 | 0 | 0 | 1 | 1 | 0 | 0 | 0 | 0 | 0 | 0 | 0 |
| PB | 0 | 0 | 0 | 1 | 0 | 0 | 0 | 0 | 1 | 1 | 0 | 0 | 0 | 0 | 0 |
| PS | 0 | 1 | 0 | 0 | 0 | 1 | 0 | 0 | 0 | 0 | 0 | 0 | 0 | 0 | 0 |
| PT | 0 | 0 | 0 | 0 | 0 | 0 | 0 | 0 | 0 | 0 | 1 | 0 | 0 | 1 | 1 |

Figure 17b

CHARGE PUMP CIRCUIT

CROSS-REFERENCE TO RELATED APPLICATIONS

This is a continuation of U.S. application Ser. No. 16/427,892, filed May 31, 2019, now U.S. Pat. No. 11,146,171, which is a continuation of U.S. application Ser. No. 15/628,021, filed Jun. 20, 2017, now U.S. Pat. No. 10,312,802, which is a continuation of U.S. application Ser. No. 14/822,559, filed Aug. 10, 2015, now U.S. Pat. No. 9,735,672, which is a continuation of U.S. application Ser. No. 13/336,835, filed Dec. 23, 2011, now U.S. Pat. No. 9,136,755, which claims the benefit of U.S. Provisional Application No. 61/427,434, filed on Dec. 27, 2010. This application also claims foreign priority to United Kingdom Application No. 1021801.4, filed Dec. 23, 2010.

BACKGROUND OF THE INVENTION

1. Field of the Invention

Aspects of the present invention relate to a bipolar output voltage charge pump circuit, i.e. a single charge pump circuit which provides a pair of opposite polarity output voltages.

2. Description of the Related Art

Bipolar, i.e. dual rail, output voltage charge pump circuits are a type of DC-DC converter that utilize transfer and storage capacitors as devices to respectively transfer and store energy such that the converter is able to provide, from a unipolar, i.e. single rail, input voltage source, a bipolar output voltage that may be different in value from that of the unipolar input voltage.

In use, bipolar output voltage charge pump circuits may comprise output storage capacitors, typically known as "reservoir capacitors" and one or more energy transfer capacitors, typically known as "flying capacitors". The terminals or connectors of the "reservoir capacitors" are permanently connected to respective output voltage terminals or nodes. In contrast, the terminals or connectors of the "flying capacitors" are capable of being switched, in a controlled sequence, to input or output voltage terminals or nodes or to the other flying capacitor terminals or nodes.

For example, a known bipolar output voltage charge pump circuit, as disclosed in the present applicants co-pending UK patent application GB 2444985, can provide positive and negative bipolar output voltages (+/−VDD/2) that are each equal to half the magnitude of the charge pump circuit's unipolar input voltage.

Furthermore, by suitable control, the co-pending UK patent application can also provide positive and negative bipolar output voltages (+/−VDD) that are each equal to the magnitude of the charge pump circuit's unipolar input voltage.

Such a known bipolar output voltage charge pump circuit uses an arrangement, i.e. a network, of switches, i.e. a switch matrix, to control the connection of the terminals of the two reservoir capacitors, i.e. the two output voltage terminals, and those of the flying capacitors. The flying capacitor terminals may be connected by these switches to: the input voltage terminal, i.e. the unipolar input voltage; the output voltage terminals, i.e. the bipolar output voltages; a reference terminal, e.g. ground potential; and to one another in order to obtain either the bipolar output voltage +/−VDD/2 or +/−VDD.

FIG. 1 schematically shows a known audio output chain 10, utilising a charge pump 12. The audio output chain 10 receives input audio signal data 14 and after processing (not shown) and amplifying the audio signal data by an amplifier 16, outputs an audio signal 18. Audio signal 18 may be output to a load 20, such as headphones, speakers or a line load, possibly via a connector (not illustrated) such as a mono or stereo jack.

As can be seen from FIG. 1, the charge pump circuit 12 receives an input supply voltage VV and a reference voltage VG, say ground, i.e. 0V, and is clocked by a clock signal CK. The charge pump circuit also has a flying capacitor 22. The output voltage VP, VN of the charge pump 12 may be +/−α.VV, where a may be 1 or 0.5. In this way, the output signal data 18, output from the amplifier 16, may be balanced around the reference VG, in this case ground.

Charge pump circuits, such as charge pump circuit 12 shown in FIG. 1, are widely used in portable electronics devices where decreasing power consumption in order to extend battery discharge time, is becoming ever more important. For an audio chain driving a 16 ohm headphone for example, typical listening levels in a quiet environment may require only 100 μW (40 mV rms or 2.5 mA rms for a 16 ohm headphone). However if this current is supplied from a +/−1.5V supply (required to drive 50 mW peaks for audibility in noisier environments) then the 2.5 mA rms sourced from the 1.5V supply consumes 3.3 mW, i.e. an efficiency of 100 μW/3.3 mW=3%. Even if the supply voltage (VP, VN) can be halved using the known charge pump described above, then the efficiency is still poor, and reducing the power supply further makes it difficult practically to get enough voltage swing from the pre-drivers (not illustrated) to drive the output transistors of amplifier 16 properly.

Further, especially at low signal levels, the power required to switch the switching devices of the charge pump may be significant enough to degrade the efficiency.

Furthermore, in order to drive transducers such as piezoelectric transducers, haptic transducers or backlights for example, bipolar output voltages of greater than VV may be required. The same output chain may be required to drive such loads in some use cases, with a consequent requirement for operating modes with bipolar output stage supply voltages greater than VV.

It is desirable to be able to operate a particular charge pump circuit, particularly an integrated circuit implementation, in various applications which may have different supply voltages available. In order to maintain similar performance with different input supply voltages, it is desirable to have a range of step-down and step-up ratios available.

Charge pumps that generate a range of output voltages may have multiple flying capacitors. These flying capacitors are generally too large to be accommodated on-chip, so require dedicated pins on the package a well as occupying area on the PCB. It is desirable to minimise the number of flying capacitors to reduce cost, package size and board area.

It is therefore desirable to provide an audio output chain and an appropriate charge pump that can supply a wide range of output stage bipolar supply voltages to reduce or minimise power consumption over a wide range of output signal levels and input supplies, while providing a low cost and small physical size.

SUMMARY OF THE INVENTION

According to an aspect of the present invention, there is provided a charge pump circuit operable to output a bipolar output voltage, comprising: an input node and a reference node for connection to an input voltage; a first output node and a second output node arranged to output the bipolar output voltage; two pairs of flying capacitor nodes; a network of switching paths for interconnecting said nodes; and a controller operable to control the network of switching paths when in use with two flying capacitors connected to the flying capacitor nodes to selectively provide a bipolar output voltage of +/−3*VV, where VV is the input supply voltage.

When in use with a first flying capacitor connected to first and second flying capacitor nodes and a second flying capacitor connected to the third and fourth flying capacitor nodes, a first reservoir capacitor connected between the first output node and the reference node and a second reservoir capacitor connected between the reference node and the second output node, the controller may be operable to control the network of switching paths such that in a first switching state the first flying capacitor node (CF1A) is connected to the input node (VV) and the second flying capacitor node (CF1B) is connected to the reference node (VG), and in a second state, the second flying capacitor node is connected to the input node, the first flying capacitor node is connected to the third flying capacitor node, and the fourth flying capacitor node is connected to the reference node.

The controller may be further operable to control the network of switching paths to selectively provide a second output voltage that corresponds to one of the group consisting of +/−3VV, +/−2VV, +/−VV, +/−VV/2, +/−VV/3, +/−VV/4, +/−VV/5 or +/−VV/6.

The two pairs of flying capacitor nodes may comprise first and second nodes for connecting to a first flying capacitor in use and the third and four nodes for connecting to a second flying capacitor in use and wherein the network of switching paths comprises a first switching path for directly connecting the input node to the first flying capacitor node and a second switching path for directly connecting the input node to the third capacitor node.

At least the first output voltage is compared with a threshold level, or the differential voltage between the two output nodes is compared with the threshold level. The threshold may be independent of the input voltage VV.

When in use with a first reservoir capacitor connected between the first output node and the reference node and a second reservoir capacitor connected between the reference node and the second output node, the controller may be operable to control the network of switching paths such that first reservoir capacitor is recharged when the first output is smaller in magnitude than a first threshold and the second reservoir capacitor is recharged when the second output is smaller in magnitude than a second threshold.

There is also provided an audio output chain arranged to receive an input audio signal and process the audio signal to drive a load, said load comprising at least one of: a headphone, a speaker, a line load, a haptic transducer, a piezoelectric transducer, and an ultrasonic transducer, the audio output chain comprising the charge pump circuit according to any preceding claim.

The controller may be operable to control the switching sequence of the network of switches in dependence on a comparison of at least one of the outputs of the charge pump with a threshold level. The threshold level may be independent of the input voltage.

The audio output chain may further comprise a charge pump controller, wherein the charge pump controller is operable to receive a control signal, the threshold level being dependent on the control signal. The control signal may be a gain or volume signal.

When in use with a first flying capacitor and a second flying capacitor connected to the flying capacitor nodes, a first reservoir capacitor connected between the first output node and the reference node and a second reservoir capacitor connected between the reference node and the second output node, the controller may be operable to control the network of switching paths such that first reservoir capacitor is recharged when the first output is smaller in magnitude than a first threshold and the second reservoir capacitor is recharged when the second output is smaller in magnitude lower than a second threshold.

The charge pump controller may be operable to receive an input audio signal, the threshold level being dependent on the input signal.

There is also provided an integrated circuit comprising the above charge pump circuit or the above audio output chain.

There is also provided an audio device comprising the above charge pump circuit. Said device may at least one of: a battery powered device, a portable device, a personal audio device, a personal video device; a mobile telephone, a personal data assistant, a gaming device, a portable computing device, a laptop and a satellite navigation system.

In another aspect of the invention there is provided a charge pump circuit operable to output a bipolar output voltage, comprising: an input node and a reference node for connection to an input voltage; a pair of output nodes arranged to output the bipolar output voltage; two pairs of flying capacitor nodes; a network of switching paths for interconnecting said nodes; and a controller operable to control the network of switching paths to selectively provide a first mode and a second mode when in use with two flying capacitors connected to the flying capacitor nodes by sequencing the network of switching paths through cycles of switching states, wherein at least the first mode corresponds to a bipolar output voltage of +/−3VV, +/−VV/4, +/−VV/5 or +/−VV/6, where VV is the input voltage, and wherein the controller is operable to modify the sequence of switching states from one cycle to another in response to a control signal.

The second mode may corresponds to a bipolar output voltage from the group consisting of +/−3VV, +/−2VV, +/−VV, +/−VV/2, +/−VV/3, +/−VV/4, +/−VV/5 or +/−VV/6.

The controller may modify the sequence of switching states by changing the order and/or number of switching states in a cycle and/or by omitting and/or replacing one or more switching states in a cycle.

The control signal may comprise at least one of: an indication of load current demand or an indication of output voltage level. The control signal may comprises a signal fed-back from the output nodes. At least one output voltage may be compared with a threshold level, or the differential voltage between the pair of output nodes may be compared with a threshold level and the control signal derived from said comparison. The charge pump circuit may comprise means for generating a differential voltage and a filter for filtering said differential voltage. The control signal may comprise an indication of voltage droop at the output nodes and may indicate which output node is in need of recharging. The controller is configured to modify the sequence of switching states to give priority to switching states which will recharge which output node is in need of recharging.

According to another aspect of the present invention, there is provided a charge pump circuit operable to output a bipolar output voltage, comprising: an input node and a reference node for connection to an input voltage; a first output node and a second output node arranged to output the bipolar output voltage; two pairs of flying capacitor nodes;

a network of switching paths for interconnecting said nodes; and a controller operable to control the network of switching paths to provide a bipolar output voltage of +/−VV/4 when in use with a first flying capacitor and a second flying capacitor connected to the flying capacitor nodes, a first reservoir capacitor connected between the first output node and the reference node and a second reservoir capacitor connected between the reference node and the second output node, wherein the controller is operable to control the network of switching paths such that in a first switching state, the second flying capacitor and the first reservoir capacitor are connected in series and the series connected second flying capacitor and first reservoir capacitor are connected in parallel with the first flying capacitor and one node of the first flying capacitor is connected to ground, and in a second state, the second flying capacitor is connected in parallel with one of the reservoir capacitors.

According to another aspect there is provided a charge pump circuit configured to receive an input voltage and operable in a plurality of modes, with two flying capacitors connected in use, to generate positive and negative output voltages wherein in at least one mode the positive and negative output voltages each have a magnitude greater than the input voltage and in at least one mode the positive and negative output voltages each have a magnitude less than half the input voltage.

In a further aspect there is provided a charge pump circuit operable to output a bipolar output voltage, comprising: an input node and a reference node for connection to an input voltage; a first output node and a second output node arranged to output the bipolar output voltage; two pairs of flying capacitor nodes; a network of switching paths for interconnecting said nodes; and a controller operable to control the network of switching paths when in use with two flying capacitors connected to the flying capacitor nodes to provide a first bipolar output voltage of +/−VV/6, where VV is the input supply voltage; wherein when in use with a first flying capacitor connected to first and second flying capacitor nodes and a second flying capacitor connected to the third and fourth flying capacitor node, a first reservoir capacitor connected between the first output node and the reference node and a second reservoir capacitor connected between the reference node and the second output node; the controller is operable to control the network of switching paths such that in a first switching state the second flying capacitor and the first reservoir capacitor are connected in series, with the fourth flying capacitor node connected to the first output node, and the series connected second flying capacitor and first reservoir capacitor are connected in parallel with the first flying capacitor and one node of the first flying capacitor is connected to ground, and in a second switching state the second flying capacitor and the second reservoir capacitor are connected in series, with the third flying capacitor node connected to the second output node, and the series connected second flying capacitor and first reservoir capacitor are connected in parallel with the first flying capacitor and one node of the first flying capacitor is connected to ground.

According to another aspect of the present invention, there is provided a charge pump circuit operable to output a bipolar output voltage, comprising: an input node and a reference node for connection to an input voltage; a pair of output nodes arranged to output the bipolar output voltage; two pairs of flying capacitor nodes; a network of switching paths for interconnecting said nodes; and a controller operable to control the network of switching paths to selectively provide a first mode and a second mode when in use with two flying capacitors connected to the flying capacitor nodes, wherein at least the first mode corresponds to a bipolar output voltage of +/−3VV, +/−VV/5 or +/−VV/6, where VV is the input voltage.

At least the first mode may correspond to a bipolar output voltage of +/−VV/5 or +/−VV/6.

The second mode may correspond to a bipolar output voltage from the group consisting of +/−3VV, +/−2VV, +/−VV, +/—VV/2, +/−VV/3, +/−VV/4, +/−VV/5 or +/−VV/6.

The second mode may correspond to a bipolar output voltage of +/−VV, +/−VV/2, +/−VV/3, +/−VV/4, +/−VV/5 or +/−VV/6.

According to another aspect of the present invention, there is provided a charge pump circuit operable to output a bipolar output voltage, comprising: an input node and a reference node for connection to an input voltage; a first output node and a second output node arranged to output the bipolar output voltage; two pairs of flying capacitor nodes; a network of switching paths for interconnecting said nodes; and a controller operable to control the network of switching paths when in use with two flying capacitors connected to the flying capacitor nodes to selectively provide a bipolar output voltage of +/−VV/6, where VV is the input supply voltage.

When in use with a first flying capacitor and a second flying capacitor connected to the flying capacitor nodes, a first reservoir capacitor connected between the first output node and the reference node and a second reservoir capacitor connected between the reference node and the second output node, the controller may be operable to control the network of switching paths such that in a first switching state, the second flying capacitor and the first reservoir capacitor are connected in series and the series connected second flying capacitor and first reservoir capacitor are connected in parallel with the first flying capacitor and one node of the first flying capacitor is connected to ground.

The steady state voltage on the first flying capacitor may be VV/2 and the steady state voltage on the second flying capacitor may be VV/3.

According to another aspect of the present invention, there is provided a charge pump circuit operable to output a bipolar output voltage, comprising: an input node and a reference node for connection to an input voltage; a first output node and a second output node (VN) arranged to output the bipolar output voltage; two pairs of flying capacitor nodes; a network of switching paths for interconnecting said nodes; and a controller operable to control the network of switching paths when in use with two flying capacitors connected to the flying capacitor nodes to selectively provide a bipolar output voltage of +/−VV/5, where VV is the input supply voltage.

When in use with a first flying capacitor and a second flying capacitor connected to the flying capacitor nodes, a first reservoir capacitor connected between the first output node and the reference node and a second reservoir capacitor connected between the reference node and the second output node, the controller may be operable to control the network of switching paths such that in a first switching state, the second flying capacitor, the first reservoir capacitor and the second reservoir capacitor are connected in series and the series connected second flying capacitor, first reservoir capacitor and second reservoir capacitor are connected in parallel with the first flying capacitor.

The steady state voltage of the first flying capacitor may be 3VV/5, and the steady state voltage of the second flying capacitor may be VV/5.

According to another aspect of the present invention, there is provided a method of controlling a charge pump circuit to generate a bipolar output voltage, the charge pump circuit comprising an input node for connection to an input voltage, a pair of output nodes arranged to output the bipolar output voltage, two pairs of flying capacitor nodes, and a network of switching paths for interconnecting said nodes, the method comprising the step of: controlling the switching of the network of switching to selectively provide a first mode and a second mode when in use with two flying capacitors connected to the flying capacitor nodes, wherein at least the first mode corresponds to a bipolar output voltage of +/−3VV, +/−VV/5 or +/−VV/6, where VV is the input voltage.

BRIEF DESCRIPTION OF THE DRAWINGS

Embodiments of the present invention will now be described with reference to the accompany drawings, of which:

FIG. 3b shows a network plan of the switching paths in the switch matrix of FIG. 3a;

FIGS. 4a-1, 4a-2, 4a-3 and 4a-4, shows the switching states of the first mode of operation;

FIG. 4b is a table indicating which of the switching paths in FIG. 3a are closed in the first mode of operation;

FIG. 4c shows the sequencing of phases of the first mode of operation;

FIGS. 5a-1, 5a-2 and 5a-3, shows the switching states of a second mode of operation;

FIG. 5b is a table indicating which of the switching paths in FIG. 3a are closed in the second mode of operation;

FIG. 5c shows the sequencing of phases of the second mode of operation;

FIGS. 6a-1, 6a-2, and 6a-3, shows the switching states of a third mode of operation;

FIGS. 7a-1, and 7a-2, shows the switching states of a fourth mode of operation;

FIG. 8b shows a network plan of the switching paths in the switch matrix of FIG. 8a;

FIGS. 9a-1, 9a-2, 9a-3 and 9a-4, shows the switching states of a fifth mode of operation;

FIG. 9b is a table indicating which of the switching paths in FIG. 8a are closed in the fifth mode of operation;

FIGS. 10a-1, 10a-2, and 10a-3, shows the switching states of a sixth mode of operation;

FIG. 10b is a table indicating which of the switching paths in FIG. 8a are closed in the sixth mode of operation;

FIGS. 11a-1, 11a-2, 11a-3, 11a-4, and 11a-5, shows the switching states of a seventh mode of operation;

FIG. 11b is a table indicating which of the switching paths in FIG. 8a are closed in the seventh mode of operation;

FIG. 11c shows the sequencing of phases of the seventh mode of operation;

FIGS. 12a-1, 12a-2, 12a-3, 12a-4, and 12a-5, shows the switching states of an eighth mode of operation;

FIG. 12b is a table indicating which of the switching paths in FIG. 8a are closed in the eighth mode of operation;

FIG. 12c shows the sequencing of phases of the eighth mode of operation;

FIGS. 13a-1, 13a-2, and 13a-3, shows the switching states of a ninth mode of operation;

FIG. 13b is a table indicating which of the switching paths in FIG. 8a are closed in the ninth mode of operation;

FIGS. 14a-1, 14a-2, 14a-3, and 14a-4, shows the switching states of a tenth mode of operation;

FIG. 14b is a table indicating which of the switching paths in FIG. 8a are closed in the tenth mode of operation;

FIG. 14c shows the sequencing of phases of the tenth mode of operation;

FIGS. 15a-1, 15a-2, 15a-3, and 15a-4, shows the switching states of an eleventh mode of operation;

FIG. 15b is a table indicating which of the switching paths in FIG. 8a are closed in the eleventh mode of operation;

FIG. 16b shows a network plan of the switching paths in the switch matrix of FIG. 16a;

FIGS. 17a-1, 17a-2, 17a-3, and 17a-4, shows the switching states of a twelfth mode of operation;

FIG. 17b is a table indicating which of the switching paths in FIG. 16a are closed in the twelfth mode of operation;

FIG. 19b shows a network plan of the switching paths in the switch matrix of FIG. 19a;

FIG. 21 shows a stereo implementation of the output chain of FIG. 20a;

DETAILED DESCRIPTION OF THE PREFERRED EMBODIMENTS

Figure 1:
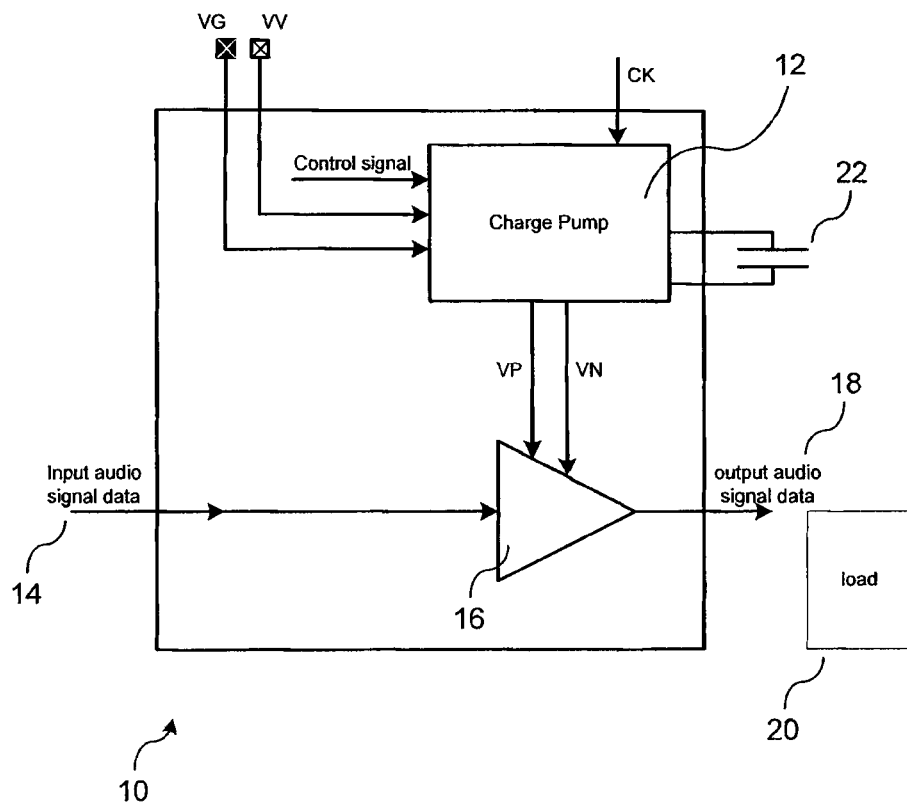
FIG. 1 schematically shows a prior art audio output chain.
Figure 2:
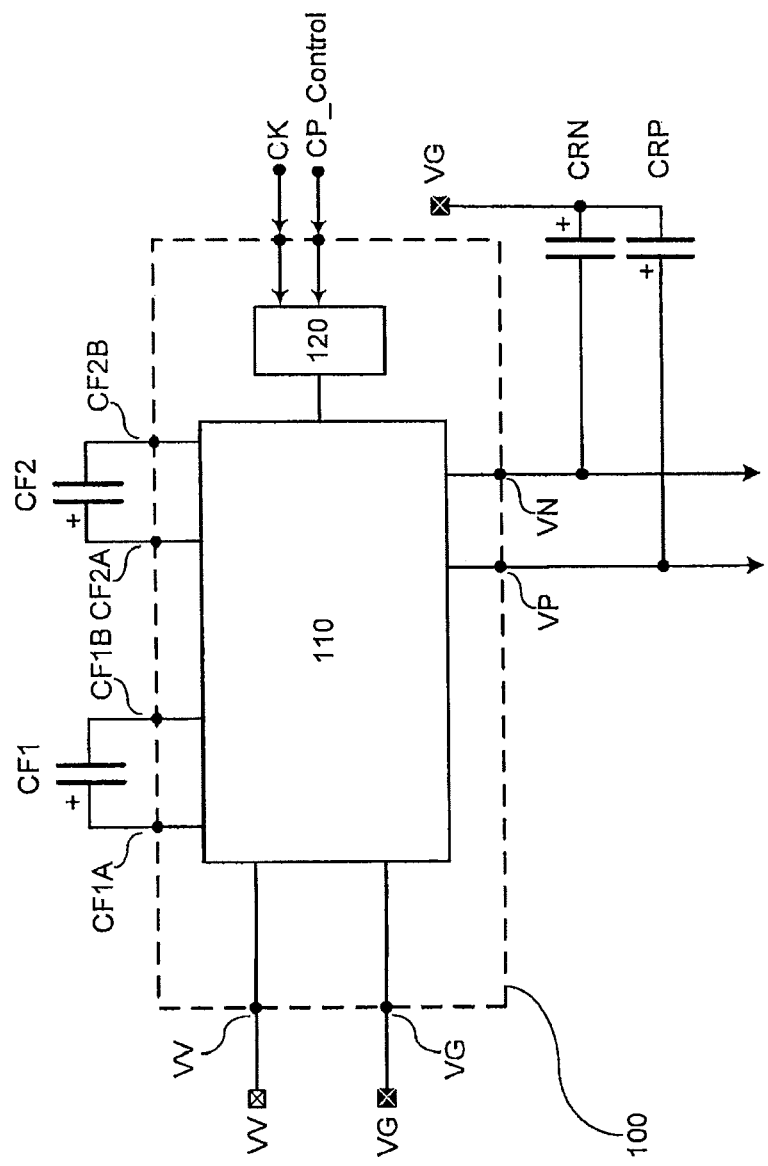
FIG. 2 schematically shows a charge pump circuit according to an embodiment of the invention.

FIG. 2 schematically shows a charge pump circuit 100 that includes a plurality of nodes and a network of switching paths, i.e. a switch matrix or switching network or network of switches, 110, for selective connection of the plurality of nodes and a controller 120 for controlling the network of switching paths. The charge pump circuit 100 includes an input node VV for receiving an input voltage, a reference node VG for receiving a reference voltage, a first flying capacitor node CF1A and a second flying capacitor node CF1B for connection with a first flying capacitor CF1, a third flying capacitor node CF2A and a fourth flying capacitor node CF2B for connection with a second flying capacitor CF1, and a pair of output nodes comprising a first output node VP, and a second output node VN.

As shown in FIG. 2 and throughout the figures, the input node VV is shown with a white box with a black cross. Likewise, the reference node VG is shown with a black box with a white cross. It should be understood that the input node VV, the reference node VG, the first and second output nodes VP, VN and the first to fourth flying capacitor nodes CF1A, CF1B, CF2A, CF2B, are nodes on the charge pump circuit for connection to components/inputs external from the charge pump.

FIG. 2 shows charge pump circuit 100 in use, i.e. with a first flying capacitor CF1 and a second flying capacitor CF2 connected to the first and second CF1A, CF1B, and third and fourth flying capacitor nodes CF2A, CF2B, respectively. A first reservoir capacitor CRP is connected to the first output node VP, and a second reservoir capacitor CRN is connected to the second output node VN. The reservoir capacitors are arranged such that in use, the negative terminal of the first CRP and the positive terminal of the second CRN reservoir capacitors are connected to the reference voltage VG.

While the positive and negative terminals on these capacitors, i.e. the terminals which in normal operation will be positive and negative with respect to each other, are identified as such, these capacitors may be polarised (e.g. electrolytic) or non-polarised (e.g. ceramic) capacitors according to normal design choice.

In the example shown in FIG. 2, the reference voltage VG is ground, i.e. zero volts, though as would be understood by a person skilled in the art, the reference voltage could be a voltage other than ground.

The controller 120 may control the network of switching paths 110 such that the charge pump circuit 100 is operable to provide a bipolar output voltage at the pair of output nodes. The term bipolar voltage is to be understood to mean two voltages of opposite polarity relative to some reference voltage, usually a ground voltage. The bipolar voltage may be symmetric, i.e. be a pair of equal and opposite voltages, centred about ground, or may be asymmetric, i.e. be a pair of unequal but opposite polarity voltages. However, as would be understood, if a reference voltage other than ground was used, a symmetric bipolar output voltage may be centred around the reference voltage.

Most embodiments of charge pump described below are operable to produce a symmetric bipolar voltage, i.e. a positive output voltage at the first output node (VP), a negative output voltage at the second output node (VN), of equal nominal magnitudes.

By control of the network of switching paths 110 by the controller 120, the charge pump circuit 100 may be operable to provide a bipolar output voltage at the first and second output nodes (VP, VN) of one of +/−3VV, +/−2VV, +/−VV, +/−VV/2, +/−VV/3, +/−VV/4, +/−VV/5, or +/−VV/6, where VV is the input voltage.

Further, the controller 120 may selectively control the switching network 110 to provide a selectable or variable bipolar output voltage at the pair of output nodes (VP, VN).

The switching network 110 may be controlled such that the bipolar output may be selectable to be one or more of +/−3VV, +/−2VV, +/−VV, +/−VV/2, +/−VV/3, +/−VV/4, +/−VV/5 or +/−VV/6.

The above voltages may be directly or indirectly selectable by means of a control signal (CP_Control) as shown. The control signal CP_Control may be generated within an audio output chain containing the charge pump 100, or may be generated externally. The charge pump may also receive an externally supplied clock CK, or may generate a clock internally.

It should be understood that the above voltages are nominal voltages. Each nominal voltage is associated with a particular control of the switch matrix, such that in ideal conditions, that nominal output voltage would be achieved. In practice however, the actual output voltage may be reduced by effects such as switch resistance and load current. In some embodiments the charge pump 100 may be regulated to supply a somewhat reduced voltage, possibly related to a reference discrete voltage (e.g. a bandgap voltage) independent of VV, which reference voltage may also vary with time, for example according to the envelope of some audio signal, although in the absence of such reduction by regulation the charge pump would be capable of generating the above nominal voltages, i.e. would still be operating in a mode corresponding to one of the nominal voltages. In some embodiments the regulation of the charge pump may render the output voltage asymmetric, even though the charge pump output would otherwise be a symmetric bipolar output voltage.

Figure 3A:
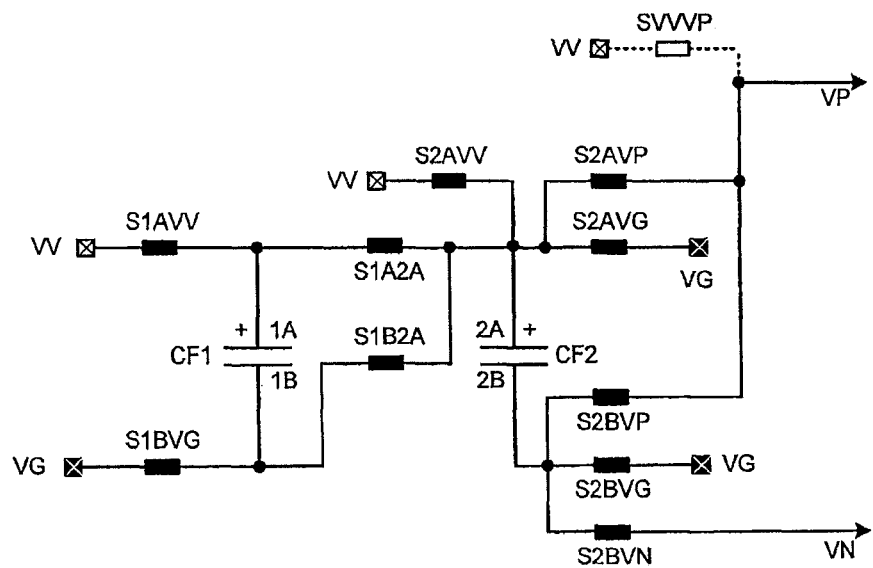
FIG. 3a shows a circuit diagram of a switch matrix according to an embodiment of the invention.

FIG. 3*a* shows a circuit diagram of a switch matrix, in which an embodiment of the network of switching paths is explicitly shown. FIG. 3*a*, like FIG. 2, shows the switch matrix having an input node (VV) for receiving an input supply voltage, a ground reference node (VG), a first output node (VP), and a second output node (VN). Like FIG. 2, FIG. 3*a* shows the switch matrix in use with two flying capacitors CF1 and CF2 connected to the first, second, third and fourth flying capacitor nodes (CF1A,CF1B,CF2A, CF2B). Although the flying capacitors and the reservoir capacitors themselves are not part of the switch matrix as defined, nor generally integrated on the same integrated circuit, they are connected to the switch matrix in use. However, it is envisaged that in a particular implementation, particularly for very light loads with a very fast switching frequency, the capacitors may be integrated into the same integrated circuit as the switch matrix and other elements of the charge pump circuit.

For clarity, the first and second reservoir capacitors (CRP, CRN) are omitted from FIG. 3*a*, although as would be understood by the skilled person, in use a first reservoir capacitor (CRP) would be connected between the first output node (VP) and the reference node (VG) and a second reservoir capacitor (CRN) would be connected between the reference node (VG) and the second output node (VN).

The network of switching paths in FIG. 3*a* comprises ten switching paths for connecting the various nodes together. Although each switching path in FIG. 3*a* is shown as comprising a single element, as would be understood by the skilled person, each switching path may comprise a number of discrete switches, e.g. single MOS switches, or MOS transmission gates, or may be a T-switch or the like, e.g. comprising such discrete switches. The switching paths provided in FIG. 3*a* are:

A first switching path S1AVV for connecting the first flying capacitor node CF1A to the input node VV;

A second switching path S1BVG for connecting the second flying capacitor node CF1B to the reference node VG;

A third switching path S1A2A for connecting the first flying capacitor node CF1A to the third flying capacitor node CF2A.

A fourth switching path S1B2A for connecting the second flying capacitor node CF1B to the third flying capacitor node CF2A.

A fifth switching path S2AVP for connecting the third flying capacitor node (CF2A) to the first output node VP;

A sixth switching path S2AVV for connecting the third flying capacitor node CF2A to the input node VV;

A seventh switching path S2AVG for connecting the third flying capacitor node CF2A to the reference node VG;

An eighth switching path S2BVN for connecting the fourth flying capacitor node CF2B to the second output node VN;

A ninth switching path S2BVP for connecting the fourth flying capacitor node CF2B to the first output node VP; and A tenth switching path S2BVG for connecting the fourth flying capacitor node CF2B to the reference node VG;

Optionally, an eleventh switching path SVVVP may be provided for connecting the input node VV to the first output node VP.

Although FIG. 3a is shown with the above ten listed switching paths, one or more of the switching paths may be removed from the circuit if not required to provide the desired functionality, i.e. if not required in any of the operational modes anticipated in a particular implementation. In particular, as described below, the SVVVP switching path SVVVP is optional, providing a more direct path for deriving +VV at output node VP when a bipolar output voltage +/−VV is required.

Figure 3B:
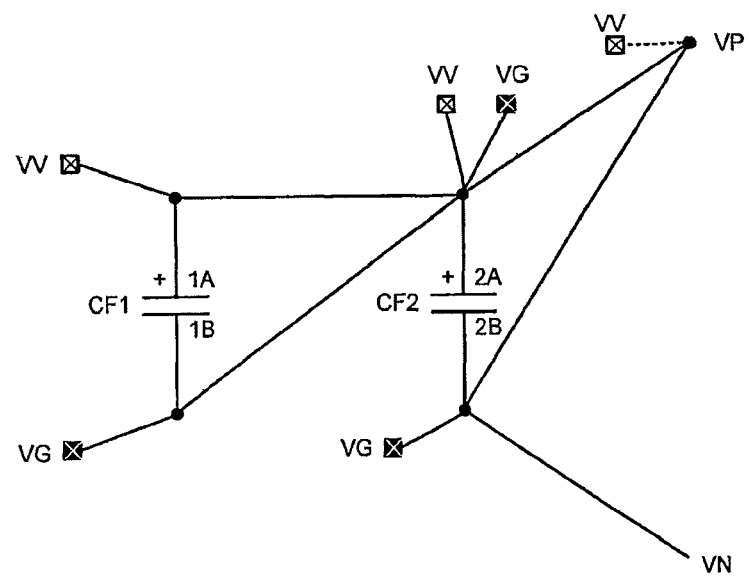

FIG. 3b shows a network plan of the switching paths in the switch matrix of FIG. 3a. Essentially, FIG. 3b shows more clearly the pairs of nodes between which there are provided respective switching paths.

Operation of various embodiments of the charge pump circuitry 100 in various modes is explained below. A mode of operation denotes a class of embodiments generating a certain bipolar voltage using a particular set of switching paths.

Each mode of operation involves sequencing though various phases of operation, termed Ph1, Ph2, etc., where each phase employs some or all of the available switching paths.

The set of switching paths employed in each phase are described as a switching state, denoted as e.g. P1, P2a or P37c, or possibly a combination of switching states, denoted as e.g. P1+P2a, P3x+P37c. A switching state may be used in more than one mode: depending on the set of switching states used in each mode, the steady-state voltage across components in each such mode may be different.

The phases employed in a mode may be sequenced in a chosen one of a plurality of possible repeated sequences, or the sequence may be modified from one cycle to another according to factors such as varying load current demand.

In the descriptions below, the switching states involved in each mode are shown schematically in figures such as FIG. 4a. Tables such as FIG. 4b are also provided to illustrate which switching paths are used (marked with a "1") and which are not used (marked with a "0") for each of the switching states of a mode. Tables such as FIG. 4c then show possible sequences of phases, i.e. combinations of switching states in various orders. Various networks of switching paths are shown in figures such as FIG. 3a, suitable for operation in various sets of modes. If some possible modes are anticipated not to be desired in use, there may be switching paths which are never employed: these may either just be always turned off or may be physically removed from the implementation to leave a smaller set of switching paths, saving space and cost.

In each mode, the output voltages are derived algebraically. The nomenclature V(CF1) is used for the voltage between the positive plate and negative plate of CF1, and similarly for V(CF2). The input supply node voltage is just referred to as VV for simplicity, and the reference voltage node VG is assumed to be at ground, i.e. zero volts. The output supply node voltages are just referred to as VP, VN, etc for simplicity, though might be considered as V(CRP), −V(CRN).

In a first mode of operation, the switch matrix of FIG. 3a may be operable to provide a bipolar output voltage of +/−VV/4 at the first and second output nodes (VP,VN).

Figure 4A:
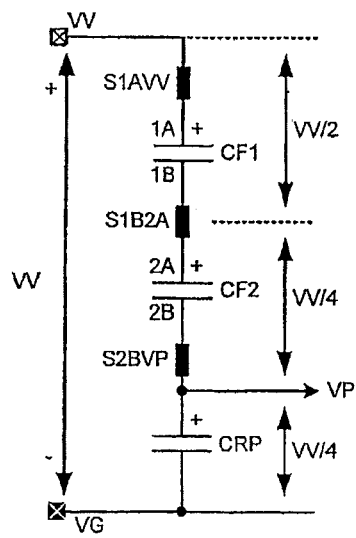
FIG. 4a, which includes
Figure 4A:
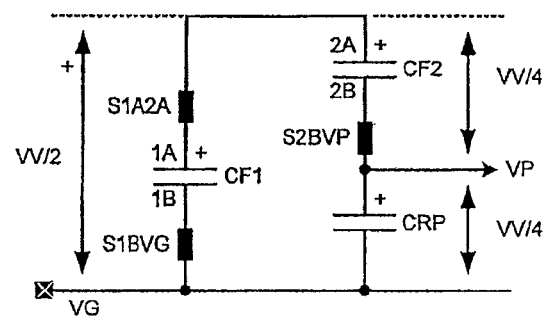
Figure 4A:
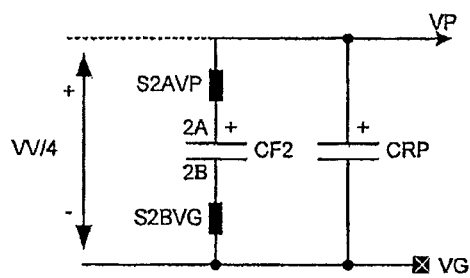
Figure 4A:
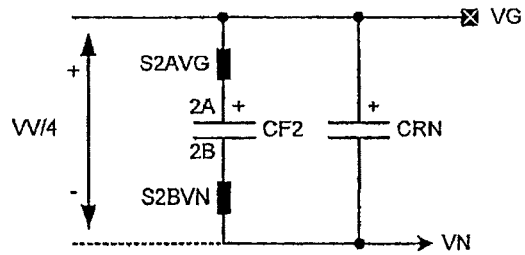

FIG. 4a illustrates one embodiment of a plurality of switching states of the switch matrix of FIG. 3a which can be used to provide the above bipolar voltage at the pair of output nodes. FIG. 4a shows the switching paths activated in each state and the resulting respective circuit topologies.

In a first state, labelled PA in FIG. 4a, the first flying capacitor CF1, the second flying capacitor CF2 and the first reservoir capacitor CRP are connected in series between the input node VV and the reference node VG. This is achieved by closing the S1AVV switching path, the S1B2A switching path, and the S2BVP switching path.

In a second state, labelled PB, the first flying capacitor CF1 is connected between reference node VG and one node CF2A of the second flying capacitor CF2, the other node CF2B of the second flying capacitor CF2 being connected to the first output node VP, i.e. the non-grounded terminal of reservoir capacitor CRP. In other words, in the second state, the second flying capacitor CF2 and first reservoir capacitor CRP are connected in series, and the first flying capacitor CF1 is connected in parallel with the series connected second flying capacitor CF2 and first reservoir capacitor CRP; the second flying capacitor terminal CF1B being connected to ground. This is achieved by closing the S1A2A switching path, the S1BVG switching path and the S2BVP switching path.

In a third state PP, the second flying capacitor CF2 and the first reservoir capacitor CRP are connected in parallel between the first output node VP and the reference node VG. This is achieved by closing the S2BVG switching path and the S2AVP switching path.

In a fourth state PN, the second flying capacitor CF2 and the second reservoir capacitor CRN are connected in parallel between the second output node VN and the reference node VG. This is achieved by closing the S2BVN switching path and the S2AVG switching path.

From inspection of FIG. 4a, the steady-state output voltages may be derived as follows by assuming there is negligible droop on each capacitor, so the voltage across each capacitor remains constant throughout the various phases.

From state PB, V(CF1)=V(CF2)+VP, but from state PP, V(CF2)=VP, so V(CF1)=2*VP.

From state PA, VP+V(CF2)+V(CF1)=VV;

substituting for V(CF1) and V(CF2) gives VP+VP+2*VP=VV, hence VP=VV/4.

Finally from state PN, VN=−V(CF2), so VN=−VV/4.

FIG. 4*b* is a table showing which switching paths of the switch matrix of FIG. 3*a* are used in each above state of this mode.

In common with other modes of operation, the various states may be sequenced in a variety of ways, FIG. 4*c* is a table showing possible sequences a, b, c, . . . of these phases.

For instance each state may be sequenced sequentially, one state in each switching phase PA, PB, PP, PN, per cycle as in sequence a, or indeed any other order of these four states. Since PA is the only state in which energy is taken from the input supply, PA may be included in more than one phase of each cycle, to allow more frequent recharging from input supply VV, for example to reduce the current spike taken from the supply each time, as shown in the 6-phase sequence b.

Also, some of the states may be omitted or replaced in particular cycles according to load demand and droop. For instance PA and PB may be sequenced in the first two phases of a three-phase cycle, and PP or PN chosen for the third phase according to which of VP or VN has drooped the most below its nominal voltage, as per sequence c. Indeed if there were little droop on both VP and VN, say, then neither PP nor PN need be selected until the droop accumulates enough to make it worth expending the switching energy involved.

In a second mode of operation, the switch matrix of FIG. 3*a* may be operable to provide a bipolar output voltage of +/−VV/3 at the pair of output nodes (VP,VN).

Figure 5A:
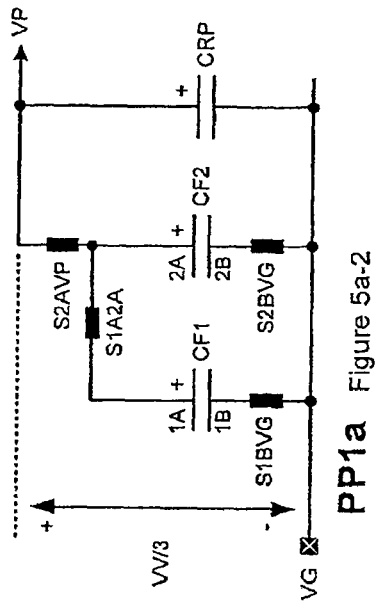
FIG. 5a, which includes
Figure 5A:
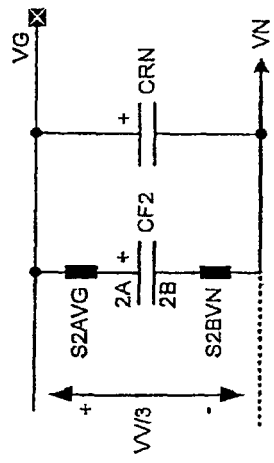
Figure 5A:
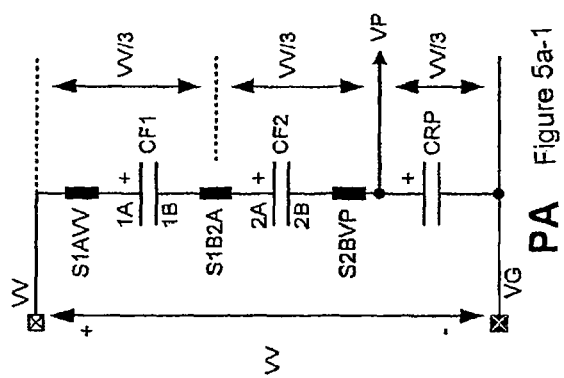

FIG. 5*a* illustrates one embodiment of a plurality of switching states of the switch matrix of FIG. 5*a* which can be used to provide the above bipolar voltage at the pair of output nodes. FIG. 5*a* shows the switching paths activated in each state and the resulting respective circuit topologies.

Please note that the first and third states, labelled PA and PN in FIG. 5*a*, are identical to the similarly labelled first and fourth states of FIG. 4*a*.

In a second state, labelled PP1A in FIG. 5*a*, the first flying capacitor CF1, second flying capacitor CF2 and first reservoir capacitor CRP are connected in parallel with each other between the first output node VP and the reference node VG.

The steady-state output voltages may be derived by similar analysis to that applied to the first mode.

From state PP1A, V(CF1)=V(CF2)=VP, but from state PA, VP+V(CF2)+V(CF1)=VV, so substituting for V(CF1) and V(CF2) gives VP+VP+VP=VV, hence VP=VV/3. Finally from state PN, VN=−V(CF2), so VN=−VV/3.

FIG. 5*b* is a table showing which switching paths of the switch matrix of FIG. 3*a* are used in each above state of this mode.

In common with the above first mode of operation, the various states may be sequenced in a variety of ways, FIG. 5*c* is a table showing possible sequences a, b, c, . . . of these phases.

For instance each state may be sequenced sequentially, one state in each switching phase PA, PP1A, PN, per cycle or indeed any other order of these four states. Since PA is the only state in which energy is taken from the input supply, PA may be included in more than one phase of each cycle, as shown in the 4-phase sequence b, to allow more frequent recharging from input supply VV, for example to reduce the current spike taken from the supply each time.

Also as with other mode of operation above, some of the states may be omitted or replaced in particular cycles according to load demand and droop. For instance PA may be sequenced as the first two phase of a two-phase cycle, and PP1A or PN chosen for the second phase according to which of VP or VN has drooped the most below its nominal voltage, as per sequence c. Indeed if there were little droop on both VP and VN, say, then neither PP nor PP1A need be selected until the droop accumulates enough to make it worth expending the switching energy involved, so the switch matrix may remain in state PA meanwhile.

In a third mode of operation, the switch matrix of FIG. 3*a* may be operable to provide a bipolar output voltage of +/−VV/2 at the pair of output nodes (VP,VN).

Figures 6A, 6B, 6C:
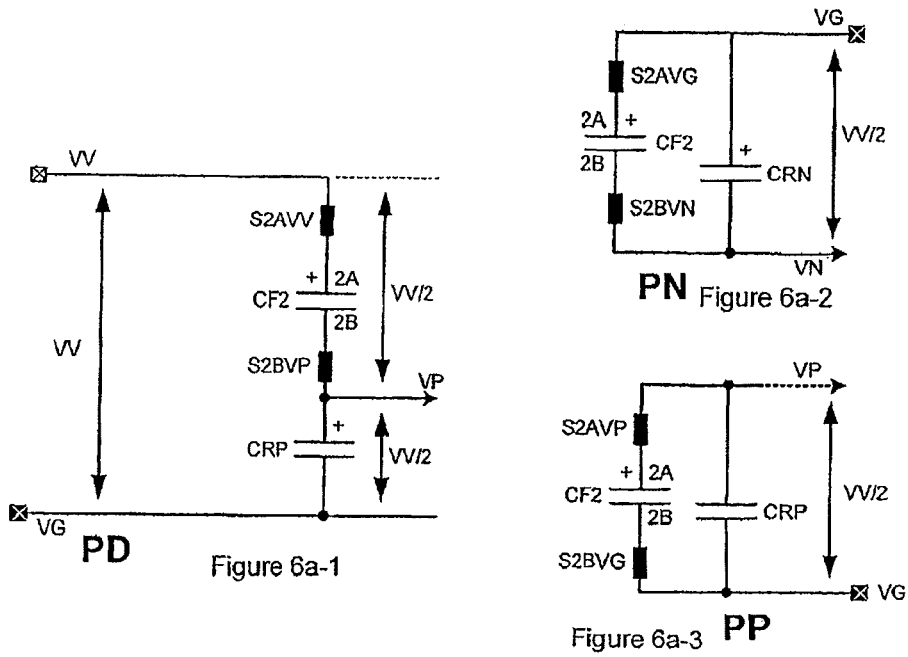
FIG. 6a, which includes
FIG. 6b is a table indicating which of the switching paths in FIG. 3a are closed in the third mode of operation.
FIG. 6c shows the sequencing of phases of the third mode of operation.

FIG. 6*a* illustrates one embodiment of a plurality of switching states of the switch matrix of FIG. 5*a* which can be used to provide the above bipolar voltage at the pair of output nodes. FIG. 6*a* shows the switching paths activated in each state and the resulting respective circuit topologies.

Please note that the second and third states, labelled PP and PN in FIG. 6*a*, are identical to the similarly labelled states PP and PN in the above described modes.

In a first state, labelled PD in FIG. 6*a*, the second flying capacitor CF2 and the first reservoir capacitor CRP are connected in series between the input node VV and the reference node VG. This is achieved by closing the S2AVV and S2BVP switching paths.

The steady-state output voltages may be derived by similar analysis to that applied to the first mode.

From state PP, V(CF2)=VP, but from state PA, VP+V(CF2)=VV, so substituting for V(CF2) gives VP+VP=VV, hence VP=VV/2. Finally from state PN, VN=−V(CF2), so VN=−VV/2.

FIG. 6*b* is a table showing which switching paths of the switch matrix of FIG. 3*a* are used in each above state of this mode.

In common with other modes of operation, the various states may be sequenced in a variety of ways. FIG. 6*c* is a table showing possible sequences a, b, c, . . . of these phases, illustrating 3-phase, 4-phase and adaptive two-phase sequences similar to those described with respect to the second mode.

In a fourth mode of operation, the switch matrix of FIG. 3*a* may be operable to provide a bipolar output voltage of +/−VV at the pair of output nodes (VP,VN).

Figures 7A, 7B:
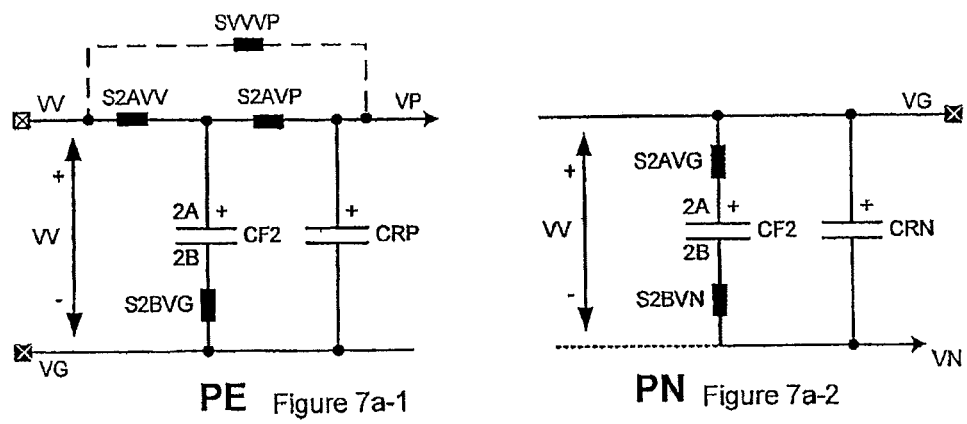
FIG. 7a, which includes
FIG. 7b is a table indicating which of the switching paths in FIG. 3a are closed in the fourth mode of operation.

FIG. 7*a* illustrates one embodiment of a plurality of switching states of the switch matrix of FIG. 3*a* which can be used to provide the above bipolar voltage at the pair of output nodes. FIG. 7*a* shows the switching paths activated in each state and the resulting respective circuit topologies.

The second state, labelled PN in FIG. 7*a*, is identical to the similarly labelled switching states of the above modes of operation.

In a first state, labelled PE in FIG. 7*a*, the second flying capacitor CF2 and the first reservoir capacitor are connected in parallel between the input node VV and the reference node VG. This is achieved by closing the S2AVV, S2AVP and S2BVG switching paths. Alternatively, this could be achieved by closing the optional SVVVP switching path together with one or both of S2AVV and S2AVP switching paths, and with the S2BVG switching path.

In operation, the second flying capacitor CF2 is charged up to VV in state PE, and then applied across second reservoir capacitor CRN in state PN, so VN=−V(CF2)=−VV.

FIG. 7*b* is a table showing which switching paths of the switch matrix of FIG. 3*a* are used in each above state of this mode.

Since there are only two states in this mode of operation, there is no choice but to alternate between states PE and PN, however the sequencing may be stopped in either state until VN droops enough to require significant recharging of CRN. Indeed, especially if CF2 is of similar or greater capacitance than and CRN it may be preferable to remain in state CN, so that both capacitors operate as reservoir capacitors to reduce the rate of voltage droop.

An optional extra switching path SVVP is shown in state PE. If present, this provides a direct path from the input supply VV to the first output node VP, in addition to the indirect path via S2AVV and S2AVP, thus presenting a lower output impedance to any load on VP. If a high current load is anticipated on VP in this mode where VP=VV this will give less voltage loss through the switch matrix, at the expense of the extra switch. However in some applications, the output impedance of the switching paths S2AVV and S2AVP may be acceptable, for instance in the case where say the third mode (VP=VV/2) can supply more than enough drive to a headphone load to provide maximum output sound power, and the higher-voltage drive is only required to drive high-impedance loads, such as line inputs, in which case the extra physical switches required to implement these extra switching paths would not be worthwhile.

Note also that in this fourth mode SVVVP may be continuously connected, i.e. also connected while state PN is activated, though this is not shown in FIG. 7a.

As described in the above first, second, third, and fourth modes, the switch matrix of FIG. 3a is operable to provide a bipolar voltage of one of +/−VV, +/−VV/2, +/−VV/3, or +/−VV/4 at the pair of output nodes (VP, VN).

Although the above describes the situations of providing single output voltages when specific switching paths of the network shown in FIG. 3a are utilized, it should be apparent that when all of the switching paths of FIG. 3a are provided the switch matrix may be operable to provide a bipolar voltage that is selectable by the controller from the group of +/−VV, +/−VV/2, +/−VV/3, or +/−VV/4 at the pair of output nodes (VP, VN). This range of selectable voltages is achieved using only two flying capacitors and ten main switching paths.

When used in the above first and second modes to provide +/−VV/3 or +/−VV/4, both the first and second flying capacitors are employed. When the same switch matrix is used to generate +/−VV or +/−VV/2 using the switch matrix of FIG. 3a, only one flying capacitor is used.

Figure 8A:
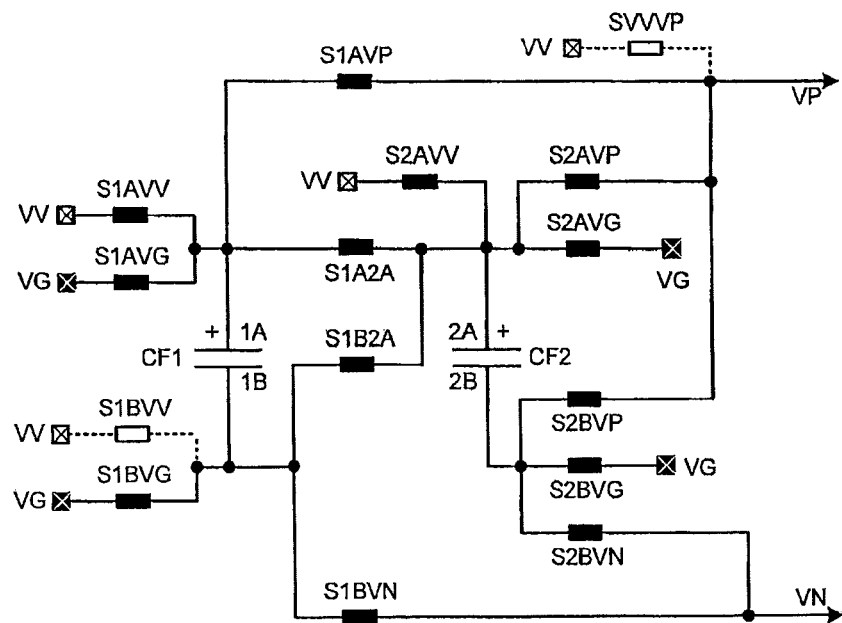
FIG. 8a shows a circuit diagram of a switch matrix according to another embodiment of the invention.

FIG. 8a shows a circuit diagram, similar to FIG. 3a, of another switch matrix, in which the network of switching paths is explicitly shown. This switch matrix comprises all the switching paths of the switch matrix of FIG. 3a, but with three additional switching paths: S1AVG provided between the first flying capacitor terminal CF1A and the reference input node VG; S1BVN provided between the second flying capacitor terminal CF1B and the second output node VN; and S1AVP provided between the first flying capacitor terminal CF1A and the first output node VP.

Figure 8B:
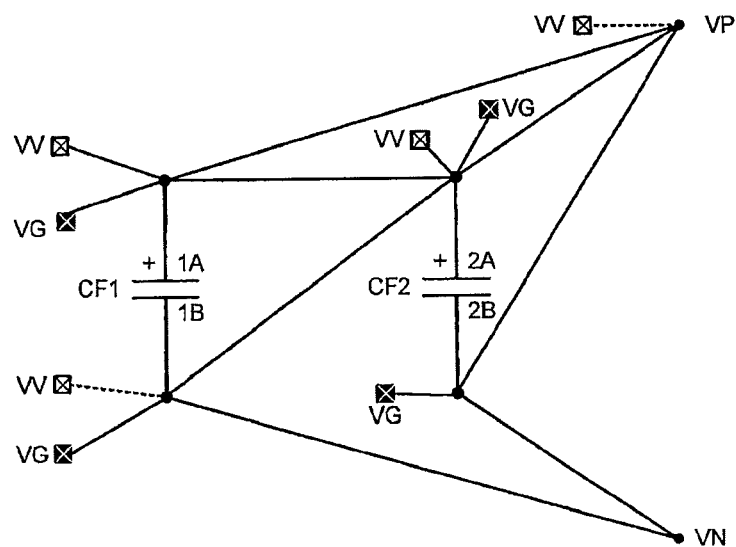

FIG. 8b shows a network plan of the switching paths in the switch matrix of FIG. 8a. Essentially, FIG. 8b shows more clearly the pairs of nodes between which there are provided respective switching paths.

As will be understood, as the switch matrix of FIG. 8a contains all of the switching paths of the switch matrix of FIG. 3a, it is thus possible to control the switch matrix of FIG. 8a to provide the first, second, third, and fourth modes as described above.

However, by providing the additional switching paths S1A2B, S1BVN, and S1AVP, the switch matrix of FIG. 8a may also be operable in fifth and sixth modes to provide a bipolar output voltage of +/−VV/5 or +/−2*VV at the first and second output nodes (VP,VN).

The extra switching paths also allow alternative modes for generating +/−VV, +/−VV/2, +/−VV/3, +/−VV/4. These may have advantages in terms of output impedance or efficiency.

Figure 9A:
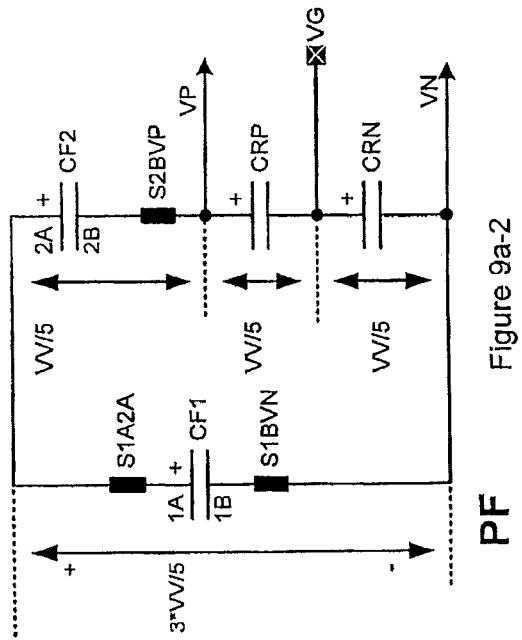
FIG. 9a, which includes
Figure 9A:
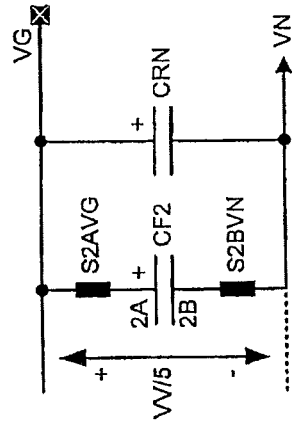
Figure 9A:
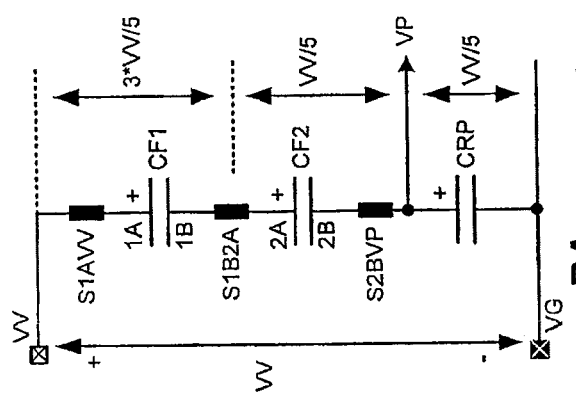
Figure 9A:
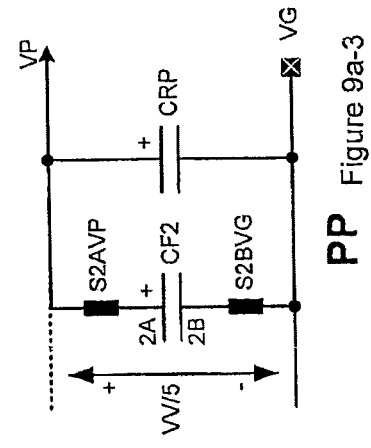

FIG. 9a illustrates one embodiment of a plurality of switching states of the switch matrix of FIG. 8a which can be used to provide the bipolar voltage +/−VV/5 at the pair of output nodes (VP,VN) in a fifth mode of operation. FIG. 9a shows the switching paths activated in each state and the resulting respective circuit topologies First, third and fourth states, labelled PA, PP, and PN respectively, are identical to the similarly labelled states in the previous modes.

In a second state, labelled PF in FIG. 9a, the second flying capacitor CF2, the first reservoir capacitor CRP and the second reservoir capacitor CRN are connected in series with each other and the first flying capacitor CF1 is connected in parallel with the series connected second flying capacitor CF2, first reservoir capacitor CRP and second reservoir capacitor CRN.

The use of state PF allows +/−VV/5 to be generated using only two flying capacitors and nine switching paths. It also allows +/−VV/5 to be generated using only one more switch (S1BVN) than in the switch matrix of FIG. 3a.

By similar analysis to previous modes, in state PF, V(CF1)=V(CF2)+VP−VN. But from state PP, V(CF2)=VP and from state PN, −VN=V(VF2). So substituting for VP and VN, V(CF1)=V(CF2)+V(CF2)+V(CF2)=3*V(CF2).

Also, from state PA, V(CF1)+V(CF2)+VP=VV. Substituting for VP and V(CF1) from above, 3*V(CF2)+v(CF2)+V(CF2)=VV, hence V(CF2)=VV/5.

Thus VP=V(CF2)=VV/5 and VN=−V(CF2)=−VV/5.

In state PF, the first flying capacitor CF1, the second flying capacitor CF2, the first reservoir capacitor CRP and the second reservoir capacitor CRN are connected together, such that the voltage on the first flying capacitor CF1 is 3*VV/5 and the voltage on the second flying capacitor is VV/5.

FIG. 9b is a table showing which switching paths of the switch matrix of FIG. 8a are used in each above state of this mode. These states may be sequenced in any order, for example PA, PF, PP, PN, . . . or PA, PP, PA, PN, PA, PF: or states omitted in some cycles, for example if there is little loading on VN for a while.

Figure 10A:
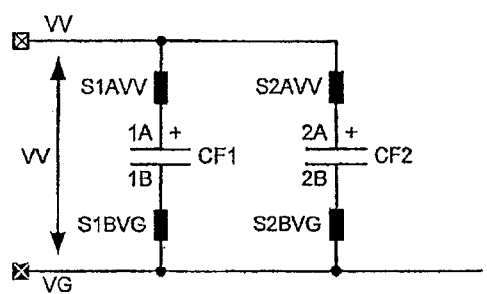
FIG. 10a, which includes
Figure 10A:
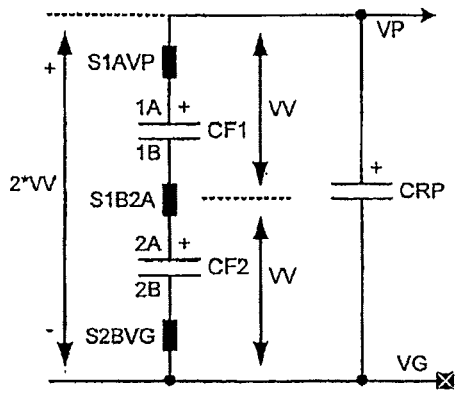
Figure 10A:
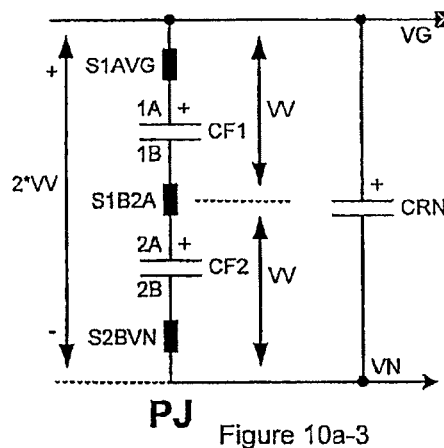

FIG. 10a illustrates one embodiment of a plurality of switching states of the switch matrix of FIG. 8a which can be used to provide the bipolar voltage +/−2*VV at the pair of output nodes in a sixth mode. FIG. 10a shows the switching paths activated in each state and the resulting respective circuit topologies.

In a first state, labelled PG, both flying capacitors (CF1, CF2) are connected in parallel between the input supply voltage (VV) and ground (VG).

In a second state, labelled PH, both flying capacitors are connected in series, and this series combination is connected in parallel across first reservoir capacitor CRP.

In a third state, labelled PJ, the series combination is connected in parallel across second reservoir capacitor CRN.

By similar analysis to previous modes, in state PG, both first and second flying capacitors CF1 and CF2 are charged to VV. In state PH, VP=V(CF1)+V(CF2)=2*VDD. In state PJ, VN=−(V(CF1)+V(CF2))=−2*VV.

FIG. 10b is a table showing which switching paths of the switch matrix of FIG. 10a are used in each above state of this mode. These states may be sequenced in any order, for example PA, PF, PP, PN, . . . or PA, PP, PA, PN, PA, PF: or states omitted in some cycles, for example if there is little loading on VN for a while.

Figure 11A:
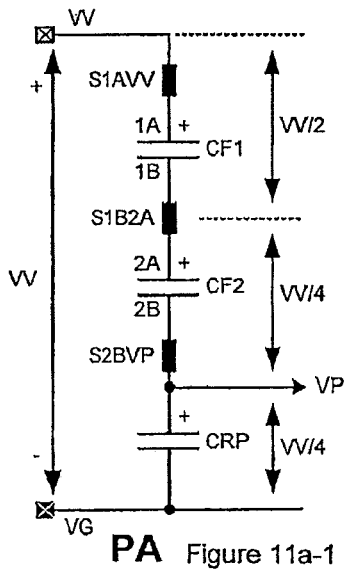
FIG. 11a, which includes
Figure 11A:
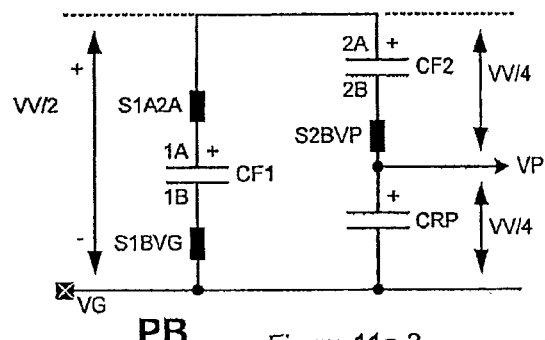
Figure 11A:
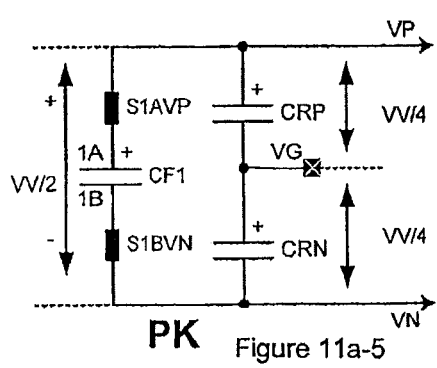
Figure 11A:
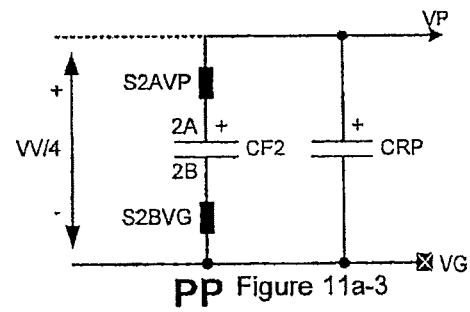
Figure 11A:
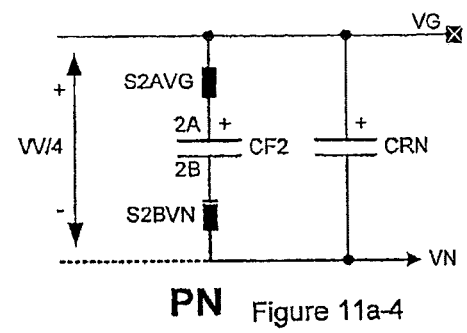

FIG. 11a illustrates one embodiment of a plurality of switching states of the switch matrix of FIG. 8a which can be used to provide the bipolar voltage +/−VV/4 at the pair of output nodes (VP, VN) in a seventh mode of operation. FIG. 11a shows the switching paths activated in each state and the resulting respective circuit topologies.

In the above described first mode of operation generating +/−VV/4, CF1 is unused while states PN or PP are active. The additional switching paths S1AVP and S1BVN added in the switch matrix of FIG. 8a allow an extra switching state in the seventh mode, labelled PK in FIG. 11a, which allows CF1 to be usefully employed. FIG. 11a also repeats the states PA, PB, PP, and PN as described above in relation to the previous modes.

In state PK, the two terminals of first flying capacitor CF1 are connected to respective output nodes VP and VN.

As shown in the analysis of the first mode, the combination of PA, PB, PP, and PN give VP=VV/4, VN=−VV/4, and V(CF1)=VDD/2. State PK is consistent with these steady-state voltages.

FIG. 11b is a table showing which switching paths of the switch matrix of FIG. 8a are used in each above state of this seventh mode.

States PA, PB, PP, PN are adequate to produce the required output voltages, but state PK allows CF1 to participate in the charging of CRN as well as CRP, giving more flexibility in optimising switching sequences for efficiency. FIG. 11c illustrates some of the possible sequences of these states. All five states may be sequenced in series, as in sequence a or in a different order, or with additional PA phases as in sequence b. But preferably, state PK is activated simultaneously with states PP or PN, as shown in sequence c. Also, if the output voltage droop is monitored then states PP or PN may be exchanged or omitted, or state PK may be omitted, in the particular cycle in progress, as shown in sequences d and e.

Figure 12A:
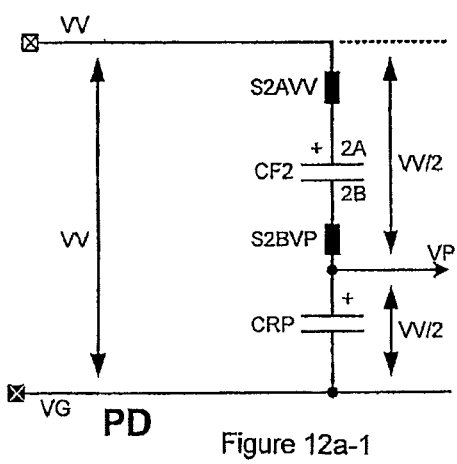
FIG. 12a, which includes
Figure 12A:
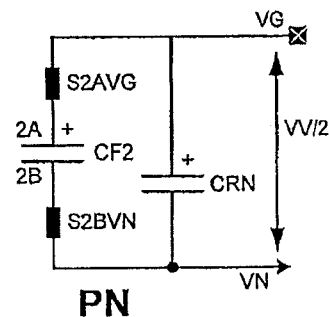
Figure 12A:
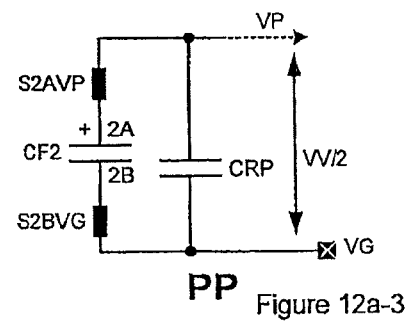
Figure 12A:
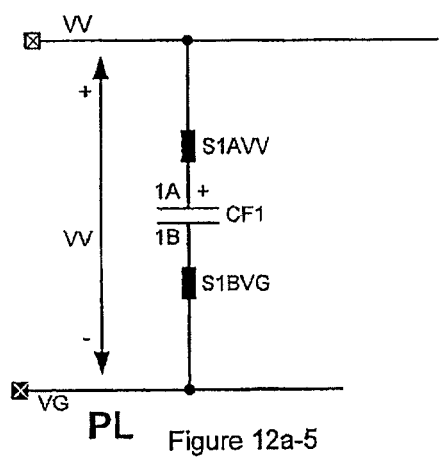
Figure 12A:
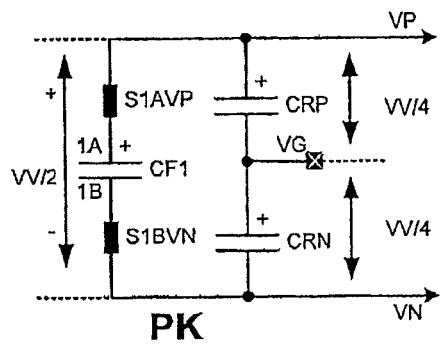
Figure 14A:
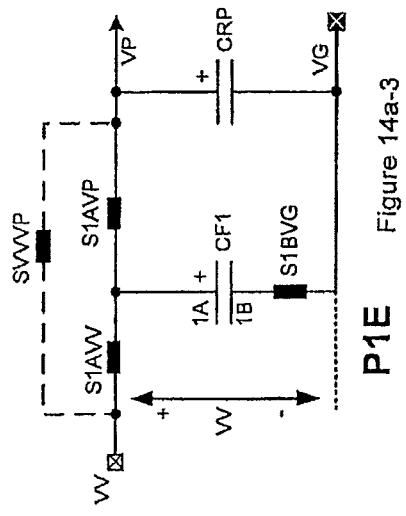
FIG. 14a, which includes
Figure 14A:
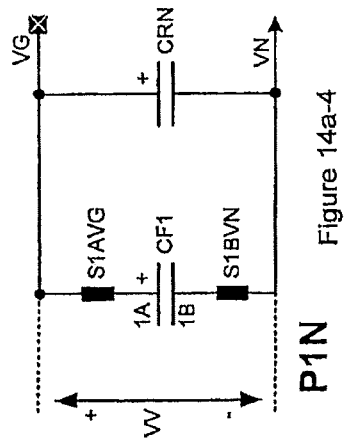
Figure 14A:
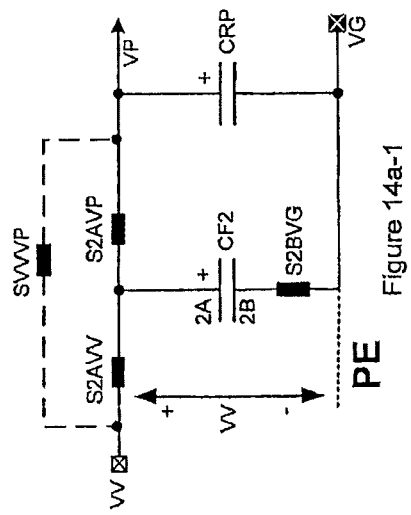
Figure 14A:
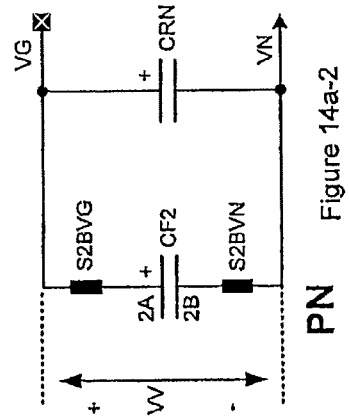

FIG. 12a illustrates an embodiment of a plurality of switching states of the switch matrix of FIG. 8a which can be used to provide a bipolar voltage +/−VV/2 at the pair of output nodes in an eighth mode of operation. FIG. 12a shows the switching paths activated in each state and the resulting respective circuit topologies In the third mode described above generating +/−VV/2, CF1 is unused, due to the absence of suitable switching paths. The additional switching paths S1AVP and S1BVN included in the switch matrix of FIG. 8a allow an extra switching state in the eighth mode, labelled PK in FIG. 12a, which allows CF1 to be usefully employed in the eighth mode. FIG. 14a also shows a further switching state labelled PL, which allows CF1 to be charged from VV. FIG. 12a also repeats the states PA, PB, PP, and PN of the third mode.

In state PK, the two terminals of first flying capacitor CF1 are connected to respective output nodes VP and VN. This is achieved by means of switching paths S1AVP and S1BVN.

In state PL, the two terminals of first flying capacitor CF1 are connected to input supply node VV and reference node VG respectively. This is achieved by means of switching paths S1AVV and S1BVG.

As shown in the analysis of the third mode, the connections made by CF2 in states PD, PP and PN give steady state output voltages VP=VV/2 and VN=−VV/2. State PL charges CF1 up to a voltage VV, in state PK V(CF1)=VP−VN, which equals VV/2+VV/2, i.e. VV, so state PK is consistent with these steady-state voltages. State PK serves to help charge CRP and CRN to give a total voltage of VV between VP and VN.

FIG. 12b is a table showing which switching paths of the switch matrix of FIG. 8a are used in each above state of this mode.

States PD, PP and PN are adequate to produce the required output voltages, but state PK allows CF1 to participate in the charging of CRN as well as CRP. FIG. 12c illustrates some of the possible sequences of these states. All five states may be sequenced in series, as in sequence a or in a different order, or with additional PD phases as in sequence b. But preferably, state PK is activated simultaneously with states PP or PN, as shown in sequence c. Perhaps with extra charging phases PD+PL as shown is sequence d. PD can be combined with PK rather than PL as shown in sequence e. Also if the output voltage droop is monitored then after a charging state PD+PL then states PK+PP or PK+PN may be exchanged or omitted following PD+PL as in sequence f, or following a state PD+PK, states PL+PN, PL+PP, or just PL may be selected. Other combinations are possible.

In a ninth mode of operation, the switch matrix of FIG. 8a may be operable to provide a bipolar output voltage of +/−VV/3 at the pair of output nodes (VP,VN).

Figure 13A:
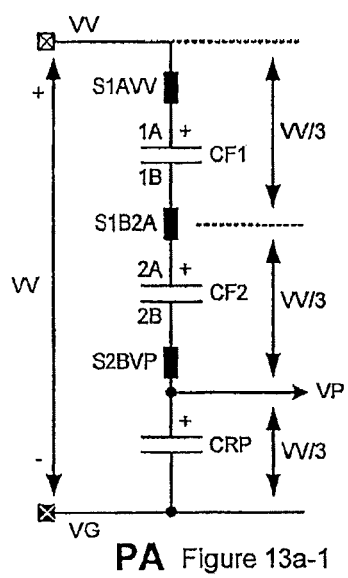
FIG. 13a, which includes
Figure 13A:
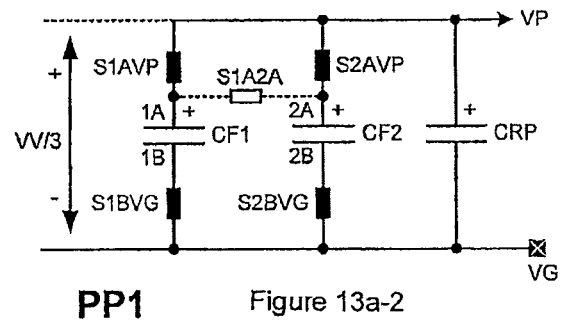
Figure 13A:
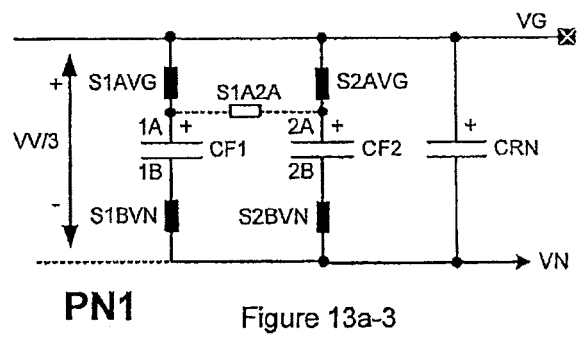

FIG. 13a illustrates one embodiment of a plurality of switching states of the switch matrix of FIG. 8a which can be used to provide the above bipolar voltage at the pair of output nodes. FIG. 13a shows the switching paths activated in each state and the resulting respective circuit topologies The first state, labelled PA in FIG. 13a, is identical to the similarly labelled states described above.

The second state, labelled PP1 in FIG. 13a, is similar in connection and equivalent in operation to state PP1a of FIG. 5a in that both CF1 and CF2 are connected in parallel between VP and VG. However, in state PP1 of FIG. 13a, the connection between CF1A and VP is achieved directly via switching path S1AVP rather than indirectly via S1A2A and S2AVP in series.

In a third state, labelled PN1 in FIG. 13a, the first flying capacitor CF1, the second flying capacitor CF2 and the second reservoir capacitor CRN are connected in parallel between the reference node VG and the second output node VN. This is achieved by closing the S1AVG, S1BVN, S2AVG and S2BVN switching paths.

Note switching path S1A2A may also be activated in states PP1 or PN1, as shown, to generate further variants of these states. Also, only two out of three of (S1AVP, S2AVP, S1A2A) or (S1AVG, S2AVG, S1A2A) are required in equivalent variants of the respective states. This is an example of how different combinations of switching paths may produce equivalent variants of the same state.

The steady-state output voltages may be derived by similar analysis to that applied to the second mode and will not be repeated.

FIG. 13b is a table showing which switching paths of the switch matrix of FIG. 8a are used in each above state of this mode.

The states PA, PP1 and PN1 may be sequenced in a variety of ways, similar to the sequences described with respect to states PA, PP1a and PN respectively of the second mode.

In a tenth mode of operation, the switch matrix of FIG. 8a may be operable to provide a bipolar output voltage of +/−VV at the pair of output nodes (VP,VN).

FIG. 14a illustrates one embodiment of a plurality of switching states of the switch matrix of FIG. 8a which can be used to provide the above bipolar voltage at the pair of output nodes. FIG. 14a shows the switching paths activated in each state and the resulting respective circuit topologies.

The first state and second states, labelled PE and PN in FIG. 14a, are identical to the similarly labelled states described above.

In a third state, labelled P1E in FIG. 14a, the first flying capacitor CF1 and the first reservoir capacitor CRP are connected in parallel between the first output node VP and the reference node VG. This is achieved by closing the S1AVV, S1AVP and S1BVG switching paths.

In a fourth state, labelled P1N in FIG. 14a, the first flying capacitor CF1 and the second reservoir capacitor CRN are connected in parallel between the reference node VG and the second output node VN. This is achieved by closing the S1AVG and S1BVN switching paths.

FIG. 14b is a table showing which switching paths of the switch matrix of FIG. 8a are used in each above state of this tenth mode.

In operation, the second flying capacitor CF2 may be charged up to VV in state PE, and then applied across second reservoir capacitor CRN in state PN, so VN=−V(CF2)=−VV. Also, the first flying capacitor CF1 may be charged up to VV in state P1E, and then applied across second reservoir capacitor CRN in state P1N, so VN=−V(CF1)=−VV.

The states PE, PN, PE1, P1N may be sequenced in a variety of ways. If only states PE and PN are used, operation is as described with respect to the fourth mode; if only states PE1 and P1N are used, operation is similar to the fourth mode, except CF1 and associated switching paths are used instead of CF2 and its associated switches. In cases of low load current demand, it may be that only one such set of states is used, or that the four states are cycled through in succession as shown as sequence a in FIG. 14c. However for lower output impedance, it is preferable to employ both flying capacitors at once, either with simultaneous flying capacitor charging phases PE and PE1, followed by simultaneous reservoir capacitor (CRN) charging phases PN and P1N (sequence b), or alternatively with these phases intermingled so the two flying capacitors work in anti-phase (sequence c).

As with other modes, the sequencing may be interrupted according to detected voltage droop or other anticipated load information.

As with the fourth mode above, an extra switching path SVVP may be connected between the input supply node VV and the first output node VP to give a direct path between these nodes.

None of the modes described above require the inclusion of switching path S1BVV between the second flying capacitor terminal CF1B and the input supply node VV. However if this switching path is included or enabled the switch matrix of FIG. 8a may also be operable in an eleventh mode to provide a bipolar output voltage of +/−3*VV at the pair of output nodes (VP,VN).

Figure 15A:
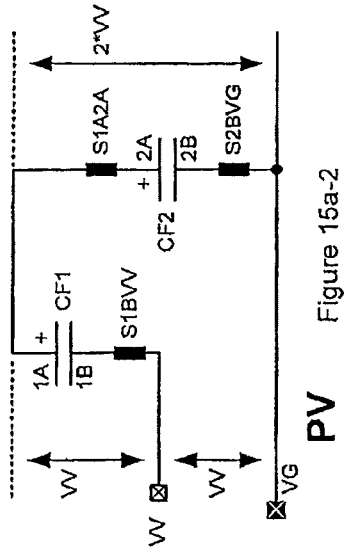
FIG. 15a, which includes
Figure 15A:
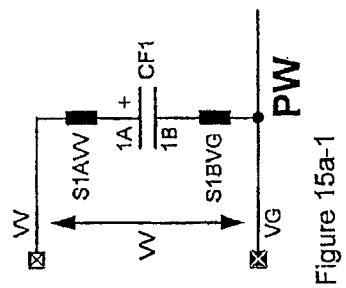
Figure 15A:
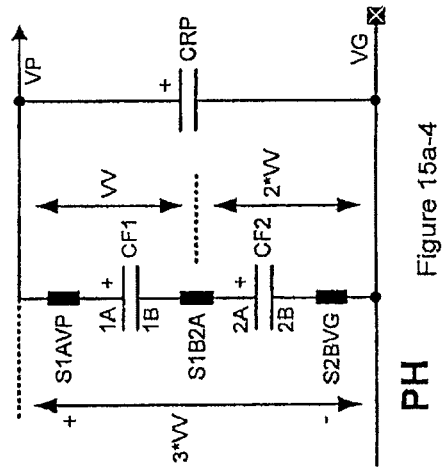
Figure 15A:
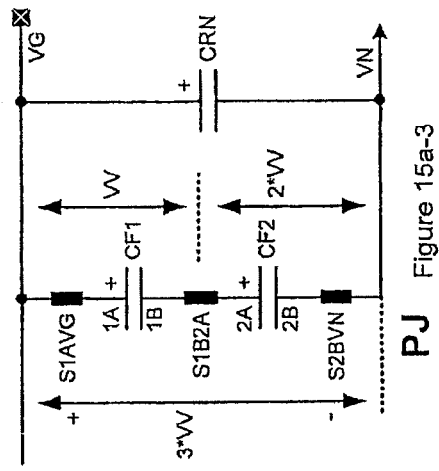

FIG. 15a illustrates one embodiment of a plurality of switching states of the switch matrix of FIG. 8a when including path S1BVV which can be used to provide the above bipolar voltage at the pair of output nodes. FIG. 15a shows the switching paths activated in each state and the resulting respective circuit topologies In a first state, labelled PW, the first flying capacitor node CF1A is connected to the input supply node VV and the second flying capacitor node CF1B is connected to reference node VG, such that (for a positive voltage at the input node VV relative to VG) the plate of the first flying capacitor connected to the first flying capacitor node CF1A is more positive than the other plate of the first flying capacitor connected to the second flying capacitor node CF1B.

In a second state, labelled PV, the second flying capacitor node CF1B is connected to the input supply node VV and the first, more positive, flying capacitor node CF1A is connected to the third flying capacitor node CF2A, the fourth flying capacitor node CF2B being connected to the reference node VG.

The third state PJ and the fourth state PH are similar to similarly labelled states of the sixth mode as previously discussed with reference to FIG. 10a.

From inspection of FIG. 15a, the steady-state output voltages may be derived similarly to analyses above.

In state PW, V(CF1) is charged to VV. In state PV CF2 is charged to VV+V(CF1)=2*VV.

In state PH, CRP is charged to V(CF1)+V(CF2)=VV+2*VV, so VP=3*VV.

In state PJ, CRN is charged to −V(CF1)−V(CF2)=−VV−2*VV, so VN=−3*VV.

The state PV is important in allowing CF2 to be charged to 2*VV, so that CF2 can then be applied in series with CF1 (charged to VV in state PW) so as to generate −3*VV in state PJ.

FIG. 15a is a table showing which switching paths of the switch matrix of FIG. 8a are used in each above state of this eleventh mode.

In common with other modes of operation, the various states may be sequenced in any order, and some states may be omitted in some cycles according to load current demand and droop.

The switch matrix of FIG. 8a, even if not including the optional SVVVP and S1BVV switching paths, contains all the switching paths of the switch matrix of FIG. 3a, so is operable in first to fourth modes to provide a bipolar voltage of one of +/−VV, +/−VV/2, +/−VV/3, or +/−VV/4 at the pair of output nodes (VP, VN). The switch matrix of FIG. 8a, even if not including the optional SVVVP and S1BVV switching paths, also provides the additional switching paths S1A2B, S1BVN, and S1AVP, so may also be operable in fifth and sixth modes to provide a bipolar output voltage of +/−VV/5 or +/−2*VV at the first and second output nodes (VP,VN). The extra switching paths, i.e. extra switches, also allow alternative modes (seventh to tenth modes) for generating +/−VV, +/−VV/2, +/−VV/3, +/−VV/4.

If the S1BVV switching path is included, the switch matrix of FIG. 8a may also be operable to provide an eleventh mode for generating +/−3*VV at the first and second output nodes (VP,VN).

Although the above describes the situations of providing different fixed bipolar output voltages when specific switching paths of the network shown in FIG. 8a are utilized, it should be apparent that when the switching paths of FIG. 8a are provided, even without the optional SVVVP and S1BVV switching paths, the switch matrix may be operable to provide a bipolar voltage that is selectable by the controller from the group of +/−2*VV, +/−VV, +/−VV/2, +/−VV/3, +/−VV/4, or +/−VV/5 at the pair of output nodes (VP,VN). This range of selectable output voltages is achievable using only two flying capacitors and thirteen switching paths.

If switching path S1BVV is included, the switch matrix of FIG. 8a may also be operable to provide a selectable eleventh mode for generating +/−3*VV at the output nodes, using a total of fourteen switching paths.

Figure 16A:
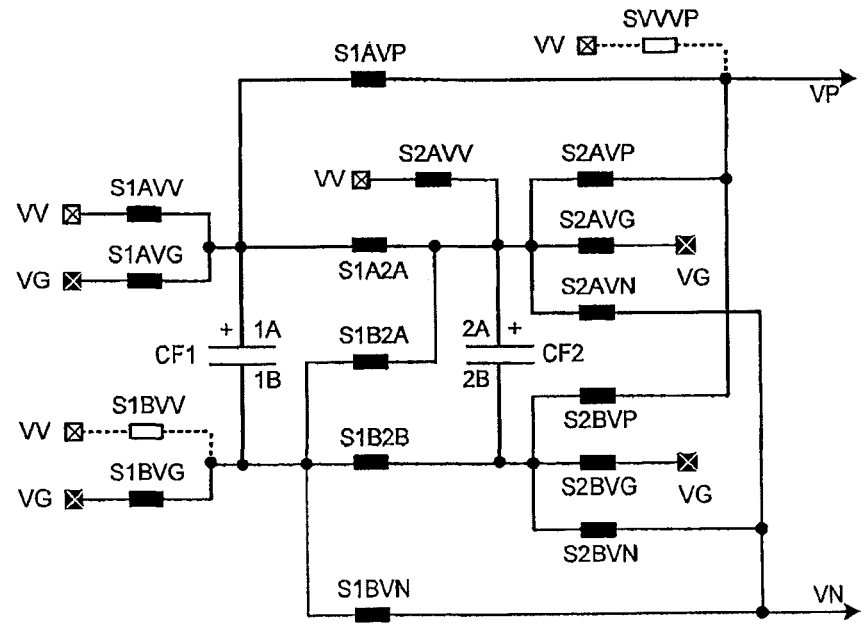
FIG. 16a shows a circuit diagram of a switch matrix according to another embodiment of the invention.

FIG. 16a, shows a circuit diagram of another embodiment of a switch matrix, that comprises all the switching paths of the switch matrix of FIG. 8a, but with two additional switching paths provided: S2AVN provided between the third flying capacitor node CF2A and the second output node VN; and S1B2B provided between the second flying capacitor node CF1B and the fourth flying capacitor node CF2B.

Figure 16B:
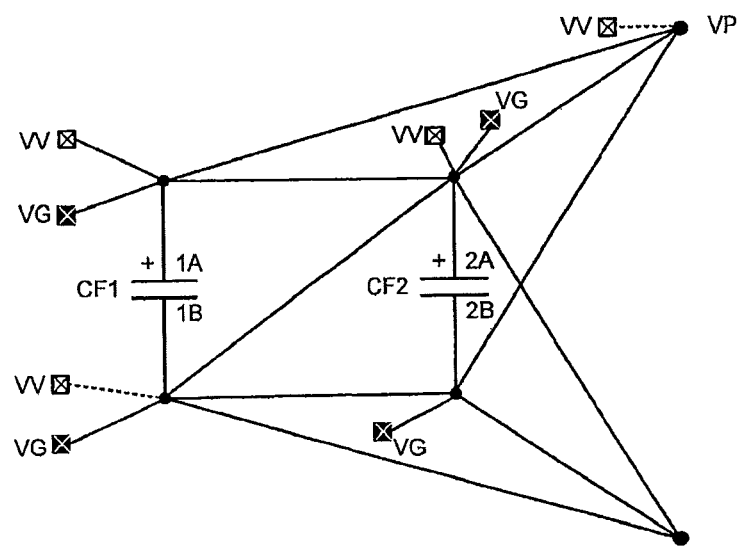

FIG. 16b shows a network plan of the switching paths in the switch matrix of FIG. 16a. Essentially, FIG. 16b shows more clearly the pairs of nodes between which there are provided respective switching paths.

By providing the additional switching paths S1B2B and S2AVN, the switch matrix of FIG. 16a may be operable in a twelfth mode to provide a bipolar output voltage of +/−VV/6 at the pair of output nodes (VP,VN).

As will be understood, as the switch matrix of FIG. 16a contains all of the switching paths of the switch matrix of FIG. 8a, it is also possible to control the switch matrix of FIG. 16a to provide the first ten modes as described above.

As above, the S1BVV switching path is only required if a bipolar output voltage of +/−3*VV is desired, generated using the eleventh mode, and the SVVVP switching path is optionally used when generating a voltage VV at the VP output node.

In a twelfth mode of operation, the switch matrix of FIG. 16a may be operable to provide a bipolar output voltage of +/−VV/6 at the pair of output nodes (VP,VN).

Figure 17A:
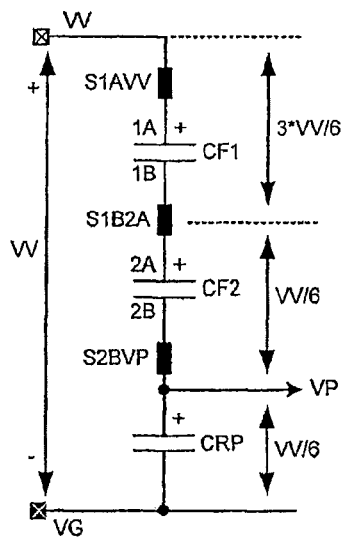
FIG. 17a, which includes
Figure 17A:
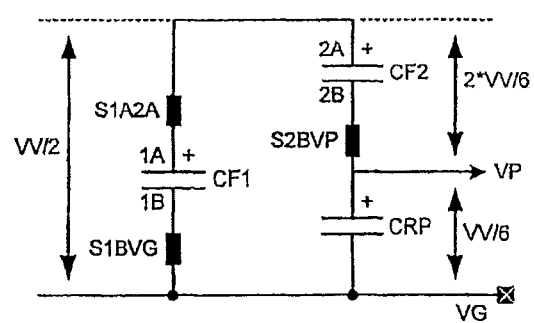
Figure 17A:
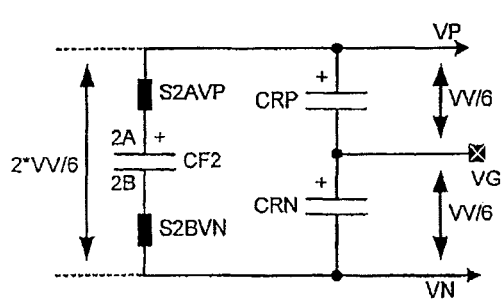
Figure 17A:
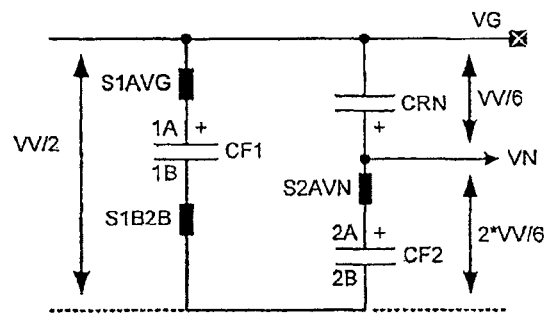

FIG. 17a illustrates one embodiment of a plurality of switching states of the switch matrix of FIG. 16a which can be used to provide the above bipolar voltage at the pair of output nodes. FIG. 17a shows the switching paths activated in each state and the resulting respective circuit topologies First state, PA, and second state, PB, are identical to states of those names already described.

In the third state, labelled PT, the first flying capacitor node CF1A is connected to the reference node VG and the second flying capacitor node CF1B is connected to the fourth flying capacitor node CF2B, and the third flying capacitor node CF2A is connected to the second output node VN, i.e. the non-grounded node of reservoir capacitor CRN.

In the fourth state, labelled PS, the second flying capacitor CF2 is connected across the output nodes VP and VN, i.e. between those nodes of both reservoir capacitors CRP and CRN not connected to reference node VG.

By similar analysis to the above modes,

In state PB, VP=V(CF1)−V(CF2), while in state PT, VN=−(V(CF1)−V(CF2)), so VN=−VP.

But in state PS, V(CF2)=VP−VN, so V(CF2)=VP−(−VP) =2*VP.

Returning to state PB, V(CF1)=V(CF2)+VP, so V(CF2) =2*VP+VP=3*VP.

But in state PA, VV=VP+V(CF2)+V(CF1)=VP+2*VP+ 3*VP=6*VP, so VP=VV/6 and hence VN=−VP=−VV/6.

FIG. 17b is a table showing which switching paths of the switch matrix of FIG. 4a are used in each above state of this mode.

The various states may be sequenced in a variety of ways. Also the state PA may be interleaved more than once in the sequence. Also as with other modes of operation above, some of the states may be omitted in particular cycles according to load demand and droop.

As described in the above twelfth mode, the switch matrix of FIG. 16a, even if not including the optional SVVVP and S1BVV switching paths, contains all the switching paths of the switch matrix of FIG. 8a, so is operable in first to tenth modes to provide a bipolar voltage of one of +/−2*VV, +/−VV, +/−VV/2, +/−VV/3, +/−VV/4, +/−VV/5 at the pair of output nodes (VP,VN). The switch matrix of FIG. 16a, even if not including the optional SVVVP and S1BVV switching paths, also provides the additional switching paths S1B2B and S2AVN, so may also be operable in a twelfth mode to provide a bipolar output voltage of +/−VV/6 at the first and second output nodes (VP,VN). If S1BVV switching path is included, the switch matrix of FIG. 16a may also be operable to provide the eleventh mode, for generating +/−3*VV at the output nodes.

Although the above describes the situations of providing different fixed bipolar output voltages when specific switching paths of the network shown in FIG. 16a are utilized, it should be apparent that when at least the switching paths of FIG. 10a are provided, even if not including the optional SVVVP and S1BVV switching paths, the switch matrix may be operable to provide a bipolar voltage that is selectable by the controller from the group of +/−2*VV, +/−VV, +/−VV/2, +/−VV/3, +/−VV/4, +/−VV/5, or +/−VV/6 at the pair of output nodes (VP,VN). This range of selectable output voltages is achievable using only two flying capacitors and fifteen switching paths.

If the S1BVV switching path is provided, the switch matrix may be operable to provide a bipolar voltage that is selectable by the controller from the group of +/−3*VV, +/−2*VV, +/−VV, +/−VV/2, +/−VV/3, +/−VV/4, +/−VV/5, or +/−VV/6 at the pair of output nodes (VP,VN). This range of selectable output voltages is achievable using only two flying capacitors and sixteen switching paths.

Figure 18:
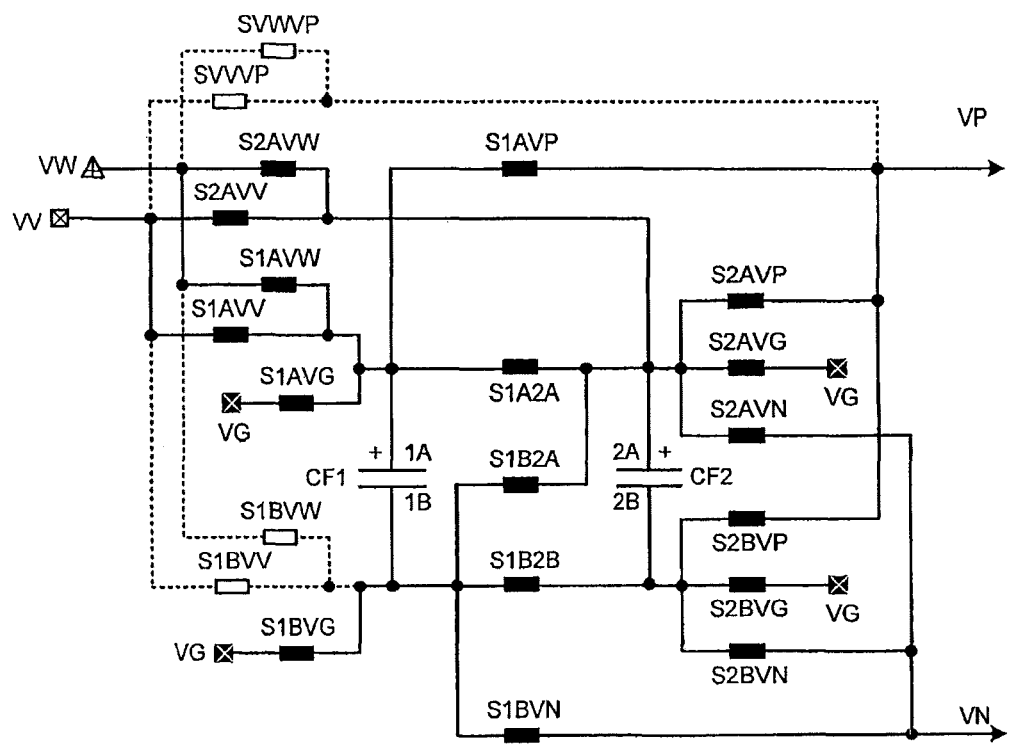
FIG. 18 shows the circuit diagram of switch matrix of FIG. 16a with an alternative input supply voltage.

FIG. 18 shows a circuit diagram, similar to FIG. 16a, of another switch matrix, in which the network of switching paths is explicitly shown. This switch matrix comprises the switch matrix of FIG. 16a, but includes an additional voltage input node VW and switching paths S1AVW and S2AVW and optionally S1BVW or SVWVP.

In the case of the controller selecting the additional input voltage VW instead of the input voltage VV, the switching paths S1AVV and S2AVV (and S1BVV or SVVVP where applicable) are left open in all of the switching phases of the above described first to twelfth switching modes and the switching paths S1AVW and S2AVW (and S1BVW or SVWVP where applicable) are used in their place.

These additional switching paths allow the switch matrix to be supplied from either VV or VW. If both VV and VW are available at the same time, but are different voltages, this allows a wider range of output voltages, i.e. a combination of those derivable from VV and those derivable from VW. In some cases, only one may be selected at a time, for example in the case of a host device being powered from a 5V USB port, or from a 3V battery-derived supply in the absence of a USB connection.

In either case, it is preferable to use these parallel switches, rather than use an upstream selector switch between VV and VW, to avoid the ohmic losses ensuing from a series connection of switches.

Although only a single additional input voltage VW is shown, as would be understood by the skilled person, any number of additional input voltages could be used by providing appropriate additional switching paths, similar to S1AVW and S2AVW (and S1BVW if necessary).

Although only a switch matrix based on the switch matrix of FIG. 16a is shown in FIG. 18, it should be apparent that the switch matrixes of FIGS. 3a and 8a could be modified in a similar way to provide an additional input voltage(s).

Figure 19A:
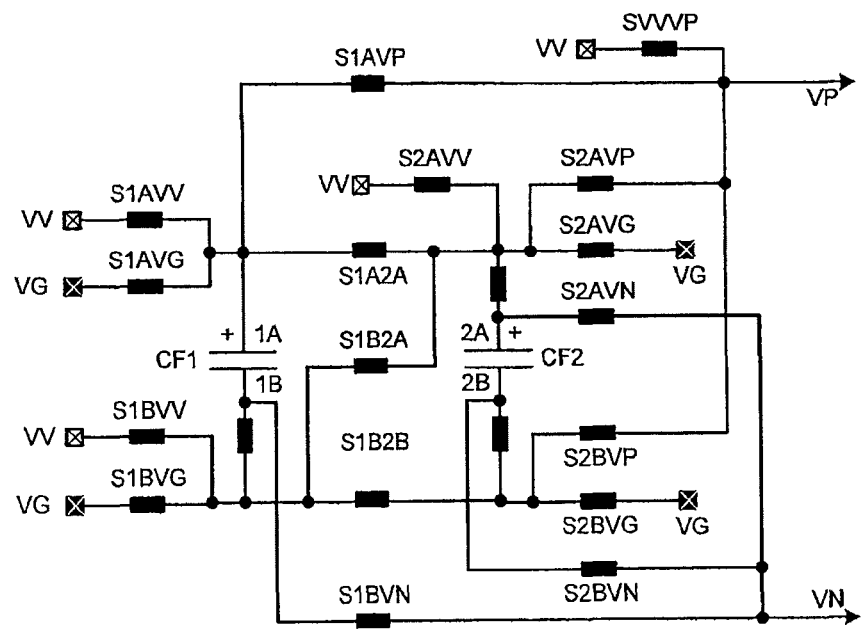
FIG. 19a shows a circuit diagram of a switch matrix according to another embodiment of the invention with additional switching paths provided to reduce stress.
Figure 19B:
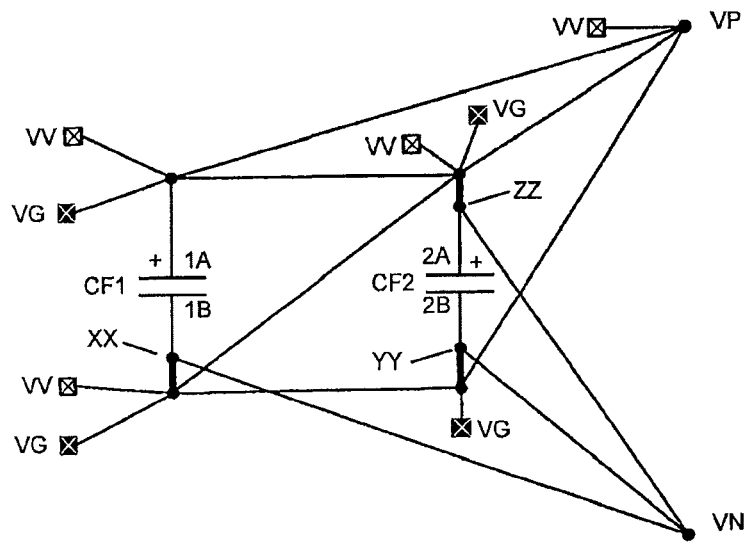

As mentioned above, switching paths may comprise either single switches or possibly equivalent nets comprising a plurality of switches. FIG. 19a shows a circuit diagram of a switch matrix comprising such nets, in which the network of switching paths is explicitly shown. FIG. 19b shows a network plan of the switching paths in the switch matrix of FIG. 19a.

The extra paths can be indentified most clearly by comparing FIG. 19b with FIG. 16b. The networks shown are similar, but FIG. 19b shows extra switching paths to those connecting flying capacitor terminals CF1B, CF2B and CF2A that are connected to switching paths to VN, with additional nodes XX, YY, ZZ where the switching paths previously connected to these terminals now terminate. For instance, in FIG. 19b the positive plate of CF2 (node CF2A) is still connected via a switching path directly to VN, but is also connected to other switching paths via an additional switching path and node ZZ, where the other switching paths previously connected to CF2A now terminate.

The additional switching paths act to reduce the stress on the switching paths connected to the second output node, VN. In particular, if these extra switching paths are deactivated during states where respective capacitor terminals (e.g. CF2A) are switched to VN, then the nearby terminals of the other, open, switching paths (e.g. S2AVP, S2AVV) to high voltage nodes VV or VP are no longer connected to the negative voltage VN so are not subjected to the maximum voltage stress (e.g. VV–VN). In such a state, node ZZ would be connected to ground (e.g. by S2AVG), reducing the stress to VN–VG. In other words, the additional switching paths act to reduce the maximum voltage across any one switching paths and its component physical switches, allowing smaller or simpler switching structures to be used to implement these switching paths, which is advantageous.

These additional switching paths involved in the connection at certain nodes do not affect the connectivity of the flying capacitor nodes to the voltage nodes VP, VN, VQ, VM, VV, and VG in each switching state. The T-switch arrangements described serve only as a variant method for implementing the required interconnection of these nodes.

Although only three additional switching paths are provided to reduce the loads, it should be apparent that fewer or more than three additional switching paths may be provided in different embodiments to reduce the stress across switching elements of the switch matrix.

Figure 20A:
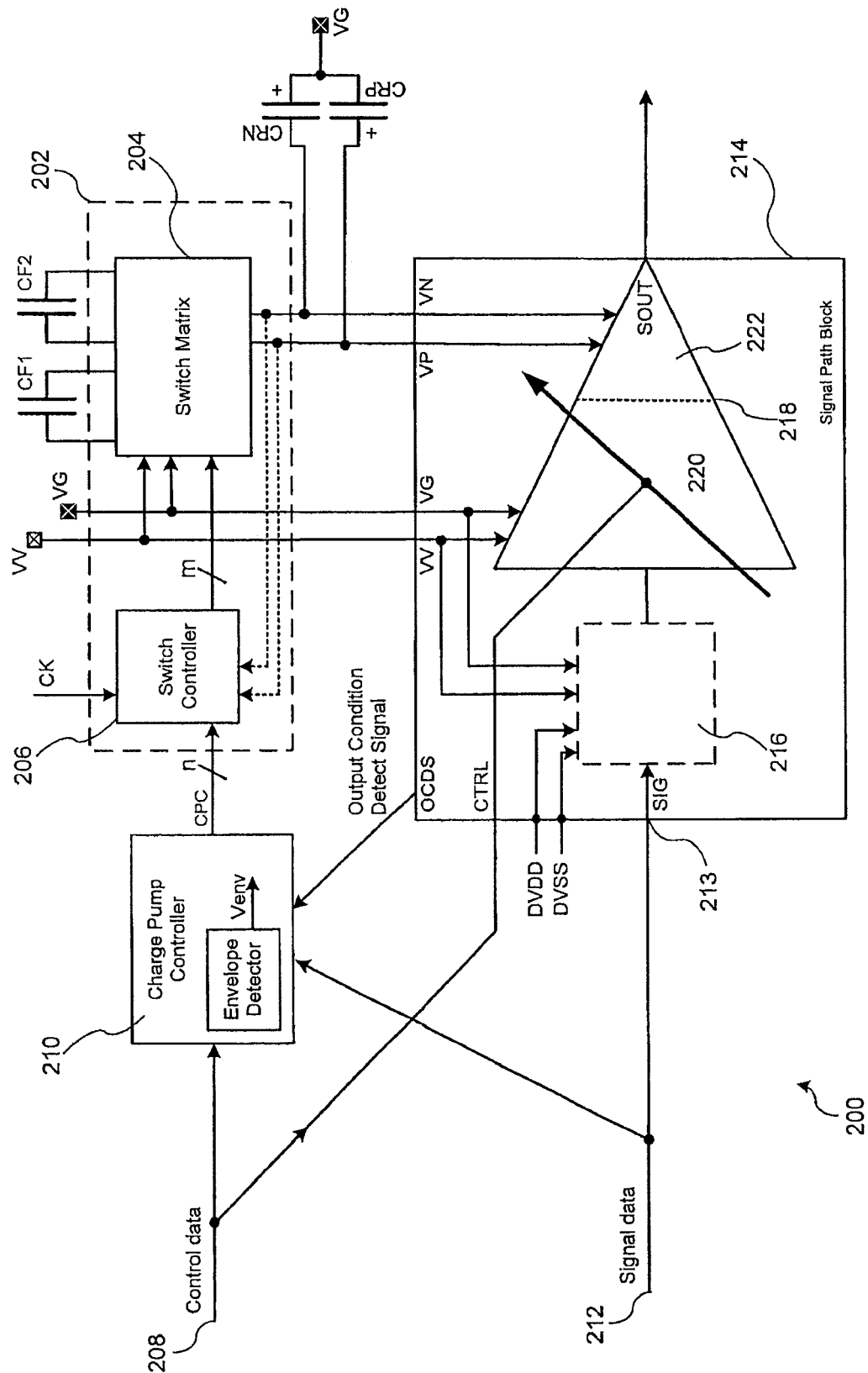
FIG. 20a schematically shows an output chain comprising the charge pump circuit according to embodiments of the present invention.

FIG. 20a schematically shows an audio output chain 200, comprising a charge pump circuit 202 operable in any one or more of the above described first to twelfth modes.

As can be seen from FIG. 20a, the charge pump circuit 202 comprises a switch matrix or network of switching paths 204 and a switch controller 206 for controlling the opening, i.e. enabling, and closing, i.e. disabling, of the various switching paths of the switch matrix 204 so as to provide the desired output voltages. The switch matrix 204 is operable to selectively connect various nodes together. These nodes may be terminals on the charge pump circuit for connection with an input supply voltage VV, a reference or ground voltage VG, first and second flying capacitors CF2, CF1, and a pair of output nodes (VP, VN), when the charge pump circuit is in use. First and second reservoir capacitors (CRP, CRN) are arranged in use for hard-wired connection to the pairs of output nodes, as described above.

Control data 208 is provided to a charge pump control block 210, which is operable to control the switch controller 206 of the charge pump circuit 202. The control data 208 may be a volume control signal, i.e. a gain signal. The control data may also include shut-down/start-up signals.

Signal data 212 is provided to a signal path block 214. The signal data may be digital or analog data, and may have already undergone some upstream (analog or digital) gain. Also, the signal data 212 may be audio data.

The signal path block 214 receives the signal data 212 at an input 213 and couples the signal data to the output driver 218. The output driver 218 includes at least an output stage 222 powered from the supplies VP, VN of charge pump 202. In this illustrated example, a preceding amplifier stage 220 is also included which may be powered from supplies VV, VG.

Other circuitry 216, for example a DAC or preamplifier gain stage, may be provided in the path from input 213 to the output driver 218. In some embodiments some of this preceding circuitry 216 and some or all preceding stages of 218 may be supplied from VV, VG.

Although not shown in FIG. 20a, other circuitry may be provided that may or may not be powered from the charge pump circuit or VV and VG. For example, this other circuitry may comprise digital filtering or a digital delay stage that may be powered from digital supplies DVDD and DVSS.

Further, a gain/volume adjustment, controlled by control data 208, may be included in the signal path block 214. The gain/volume adjustment could be performed digitally, i.e. before a DAC (not illustrated), or in an analog fashion in an analog non-final stage, or in/around the output driver 218.

The output of the signal path block 214 is provided to a load (not illustrated) that may be a headphone, speaker, line load, or another type of transducer, such as a haptic or piezoelectric transducer or an ultrasonic transducer, possibly via a connector (not illustrated) such as a mono or stereo jack. It will therefore be understood that the audio signal may include data transformed to/from audible sounds, such as music and speech and the like but the audio signal may additionally or alternatively comprise ultrasonic data and/or waveforms for driving haptic transducers etc and the terms "audio", "audio signal," and "audio output chain" should be understood accordingly.

As described above in the first to twelfth modes, the nominal charge pump bipolar output voltage may be selectable to be one of: +/−3*VV, +/−2*VV; +/−VV; +/−VV/2; +/−VV/3, +/−VV/4; +/−VV/5 or +/−VV/6. In other words, the switch controller may be operable to drive the switch matrix to selectively provide modes corresponding to these voltages.

The output voltages (VP, VN) from charge pump circuit 202 may be selected via charge pump control block 210 based on the input control data 208. The input control data 208 may be, for example, a volume control signal, that may be independent of the signal data 212. The charge pump output voltages may then be set to allow adequate headroom, so as to avoid clipping, even for a maximum input signal 212 at the specified gain. However, if the input signal is consistently less than the maximum expected amplitude, the charge pump output voltages will be unnecessarily large, therefore wasting power. Thus, it is advantageous to make the charge pump output voltage and possibly other operational parameters, dependent on the input signal 212, possibly in addition to the control data 208.

The charge pump control 210 may thus comprise envelope detection circuitry to derive a signal Venv indicative of the size of the input signal 212. The envelope detection circuitry may, for example, peak detect the input signal, responding rapidly, with a relatively short attack time, to any increase in signal magnitude, but reacting more slowly, with a longer decay time, to any decrease in the input signal. From the signal Venv, the charge pump control 210 may derive and output to the switch controller 206 of the charge pump circuit 202 a charge pump control signal CPC.

The control signal CPC may thus be indicative of the size of the envelope of the signal data 212. The charge pump circuit 202 may then be controlled based on the control signal CPC to supply corresponding output voltages VP, VN. The output voltages of the charge pump circuit 202 may therefore vary with the control signal CPC such that a relatively large envelope will lead to a relatively high voltage being supplied by the charge pump circuit and conversely, a small envelope will lead to a relatively small voltage being supplied by the charge pump circuit. If the envelope detector circuitry employs a relatively short attack time, this will ensure that rapid spikes in the signal data 212 will result in a rapid reaction by the envelope detection circuitry and thus a rapid response can be made so as to increase the supply voltage, whereas the long decay time will avoid unnecessary switching of the control signal CPC, since it is quite likely that one high-amplitude signal peak will be followed soon after by another.

Another example of envelope detection circuitry may comprise a detector to detect an envelope Venv of the input signal and compare it with some threshold value. If the detected envelope is below the threshold, the charge pump circuit 202 may be controlled to provide a relatively low voltage, and if the detected envelope is above the threshold, the charge pump circuit 202 will provide a relatively high voltage. To avoid unproductive switching between charge pump voltage levels that might waste more energy than it saves, there may be some hysteresis applied to the comparison, or there may be a minimum timeout imposed before the charge pump 202 is allowed to be instructed via the control signal CPC to reduce its output voltage(s).

More generally, the envelope detection circuitry may not contain an explicit peak detector, or actual signal Venv, but the charge pump control signal CPC may be generated by other means, for instance a comparator coupled without peak detection to the input signal data 212, the comparator having hysteresis and/or a timeout, to effectively provide a type of envelope detection and generate charge pump control signal CPC.

Depending on the attack and decay time constants, or the hysteresis or time out, the signal Venv output from the envelope detector may follow the instantaneous input signal 212 more closely or less closely. It may essentially track the instantaneous input signal.

As stated above, output driver 218 and/or elements of block 216 may comprise means for applying gain to what becomes the output signal. The envelope detector preferably takes signal data before these gain blocks, so that the input signal is sampled before any processing delay suffered in the output driver 218 or any circuitry 216 preceding it. In particular, circuitry 216 may include a digital interpolation filter (not illustrated) preceding an over-sampling DAC (not illustrated) which may introduce a processing delay to the signal. Any such delay will relax the requirements on the attack time of any peak detector and give the charge pump 202 more time to ramp up its output voltage(s) in time to avoid overload due to a sudden signal spike. The envelope detector may include an asymmetric delay, allowing a quick response to any increase in signal level, but a delay before its output is allowed to start decaying, to avoid the charge pump output decaying before the signal has propagated through the above processing delay.

However since the swing of the output signal from driver 218 is subject to this variable gain, the signal sampled upstream is not directly representative of the output signal. There are several ways of correcting for the effect of this gain applied downstream from the point where the signal is tapped off for application to the envelope detector: an equivalent gain may be inserted in the path between applied input signal 212 and the envelope detector within charge pump control block 210; the envelope detector output signal may be adjusted in amplitude to allow for the gain applied in the signal path; the threshold level applied to the envelope detector output signal may be adjusted to compensate for the programmed gain.

In other words, the charge pump 202 may be controlled by a charge pump control signal derived from the input audio signal prior to some application of gain controlled by a gain control, or volume, signal, the charge pump control signal being adjusted according to the gain control, or volume, signal.

The charge pump control block 210 may also have an output for controlling the bias current of stages of the output driver 218. For example, if the signal to be output from output driver 218 can be predicted to be small, say on the basis of input signal size or volume setting, it will be possible to reduce the bias of at least the output stage without causing too much, or indeed any, distortion. If the output driver is set to a low gain, the contribution of preceding stages to the total output noise may be reduced, so the input stage bias of these stages may be reduced without a significant impact on this output noise. These biases may conveniently be controlled via the charge pump control block 210.

The control signal from the charge pump control block 210 is provided to the switch controller 206. The switch controller 206 outputs drive signals for the switches in the switch matrix 204 of the charge pump 202.

The switch controller 206 may control the switch matrix 204, based on the control signal from the charge pump control 210, to provide the necessary switch selection and phasing to generate a selected value of bipolar output voltage at (VP,VN). As described above, the nominal bipolar output voltage may be selectable to be +/−3VV, +/−2VV, +/−VV, +/−VV/2, +/−VV/3, +/−VV/4+/−VV/5 or +/−VV/6.

Also, the switch controller 206 may control the switch matrix 204, to vary other operational parameters of the charge pump, for instance the frequency or sequencing of switching of the switches in the switch matrix 204 based on the control data 208, for example a volume control signal, or the envelope detector output signal in order to reduce switching activity when light loading is anticipated but not give rise to excessive ripple when heavy loading is anticipated.

Thus the switching frequency of the switches or the sequence or selection of states or other operational parameters of the charge pump 202 may be modulated according to a control signal fed forward from the switch controller. However in some embodiments the switching of the switches or other operational parameters may be influenced by signals fed back from the charge pump output nodes.

Figure 20B:
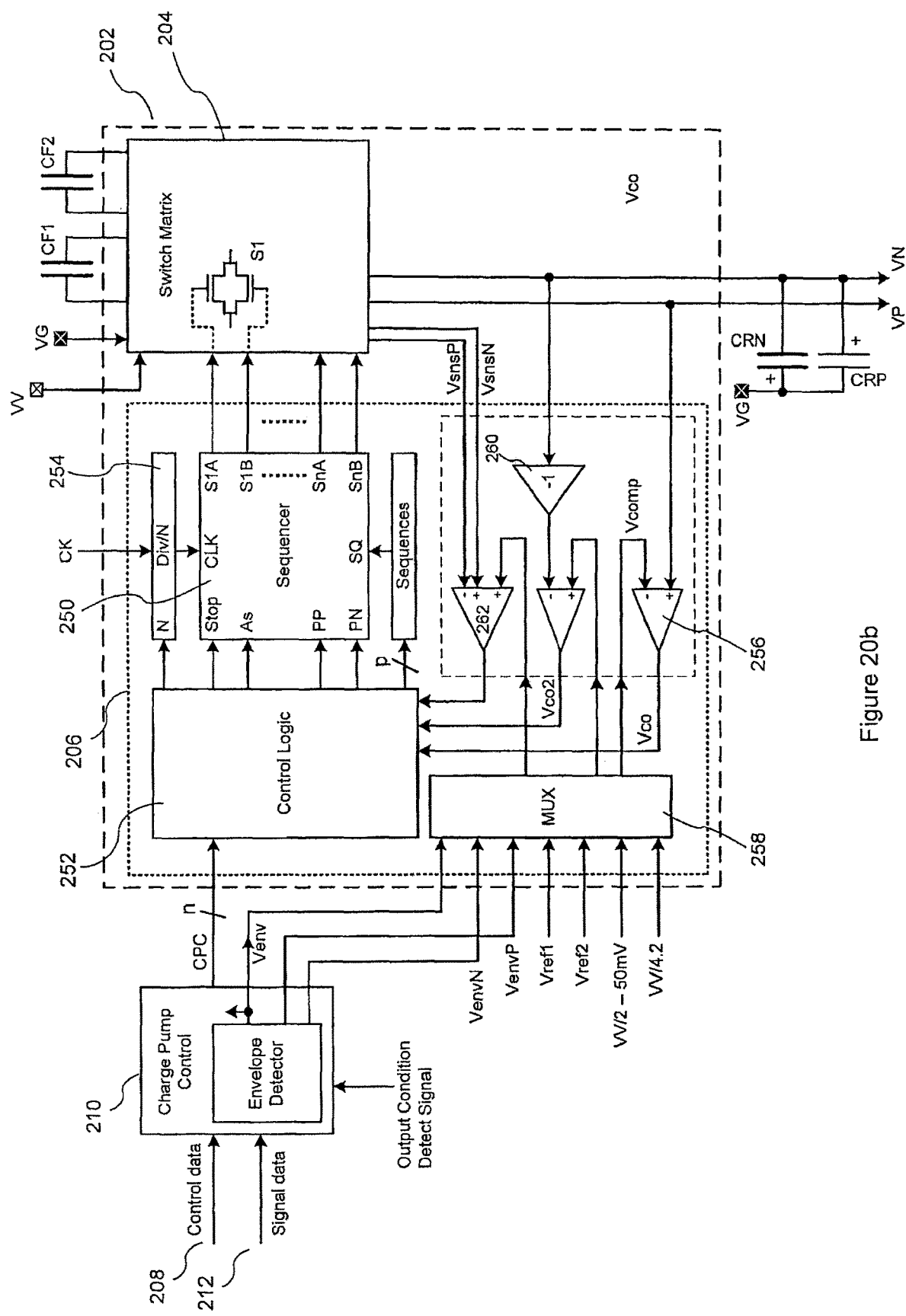
FIG. 20b schematically shows a feedback circuit that enables charge pump control.

Referring to FIG. 20*b*, a charge pump control block 210 is shown controlling a charge pump 202 comprising a switch matrix 204, i.e. a network of switches, controlled by a switch control block 206 so as to generate an appropriate charge pump bipolar output voltage (VP, VN). In FIG. 20*b*, more details of an embodiment of the switch control block 206 are explicitly shown. The switch control block 206 is shown to comprise a sequencer 250 which drives switches in the switch matrix under control of a control logic block 252, which can select a division ratio N for a clock divider 254 which divides the frequency of the incoming clock CK before application to the sequencer 250, and which can select one of various stored sequences for the sequencer 250 to sequence through. The control logic 252 also controls the sequencer output by various other outputs and according to various other inputs which will be described in turn below.

As mentioned above, power consumed by the charge pump 202 in switching the switches can be reduced by interrupting the switching sequence, only activating the switches when the voltage on a reservoir capacitor (CRP, CRN) has drooped enough to render it worthwhile expending the energy involved in switching the necessary switches. The voltage droop can be detected by comparing the actual output voltage with a comparison voltage, equal to say a voltage smaller than the target by an amount equal to the tolerable voltage droop, and passing the result of such a comparison as a comparison control signal to the control logic 252 in the switch controller 206 to interrupt the sequencing.

In FIG. 20b, the charge pump output voltage VP is shown input to comparator 256, where it is compared to a comparison voltage Vcomp selected from one of a plurality of comparison voltages (VenvP, VenvN, Vref1, Vref2, VV/2-50 mV, VV/4.2) input to a multi-input, multi-output, multiplexer 258. The comparator output signal Vco is input to logic in the control logic block 252. This control logic block can command the sequencer to stop sequencing via an input labelled "Stop".

The comparison may be performed by equivalent means. For example, a difference voltage may be generated by a difference amplifier stage (not illustrated), this difference voltage representing the difference between the nominal and actual output voltage, and this difference voltage may be compared against a reference representing the allowable droop by a comparator similar to comparator 256.

Similarly, the differential output voltage, VP−VN, may be generated by a difference amplifier stage (not illustrated), and this differential voltage compared to a threshold voltage.

In either case, the generation of this difference voltage may include some low pass filtering to smooth out switching spikes or some high pass filtering to make the comparison sensitive to any increase in the slope of the droop to try and anticipate any increase in loading.

The nominal output voltage of the charge pump circuit described above is a rational fraction, possibly improper, or multiple of the input supply voltage, so the comparison voltage Vcomp may be set slightly below this fraction of the supply voltage, for example the self-explanatory multiplexer inputs labelled "VV/2=50 mV" or "VV/4.2". Alternatively, the comparison voltage Vcomp may be set at an absolute value, for example the multiplexer inputs labelled Vref1 and Vref2, perhaps derived from a supply-independent voltage reference such as a bandgap voltage reference, especially if the maximum amplifier output signal is well defined in terms of absolute voltages, rather than itself being a fraction of the supply voltage.

The output voltage when operating in a mode corresponding to a particular nominal bipolar output voltage, say +/−VV/2 will thus settle out to a lower voltage, possibly a significantly lower voltage if the reference is set to a supply-independent value and the applied supply voltage increases above its minimum or its nominal value. However the charge pump may still be considered to be operating in a mode corresponding to the nominal output voltage associated with that mode.

The comparison voltage Vcomp may be fixed, or may be changed during use, for example according to the selected output voltage of the charge pump, for example by the control logic altering the multiplexer connections, or some other alteration of a received reference voltage.

The comparison voltage Vcomp may be variable, for instance based on the output Venv of the envelope detector shown in FIG. 20b. If the input audio signal 212 becomes small, the reservoir capacitors would then be allowed to discharge down to a similarly small value or some minimum headroom voltage before being recharged, thus saving switching energy.

Each reservoir capacitor voltage (VP, VN) may be monitored independently, with respect to respective comparison voltages. Charge pump output voltage VN is shown being input to a second comparator 260 to generate a second comparator output signal Vco2 for use by the control logic block 252. For convenience VN may be inverted as shown before input to the comparator 260, this conveniently allows a common comparison voltage to be used for both comparators if a symmetric response is desired.

Suitable logic in the switch controller 206 can then determine from Vco and Vco2 which reservoir capacitor or capacitors are in need of recharging, and can thus modulate the switching sequence accordingly so as to cope efficiently with an asymmetric loading. The control logic 252 inputs control signals PP and PN that instruct the sequencer to give priority to switching states which will recharge reservoir capacitors CRP or CRN respectively. If no reservoir capacitor needs recharging, the switching sequence may be interrupted, i.e. stopped, until a voltage on one of the reservoir capacitors (CRP, CRN) does droop enough to be worthwhile expending the switching energy needed to recharge it.

If the envelope detector in the charge pump control 210 provides an indication of the magnitude of the input signal 212, this common magnitude signal Venv may be used for both positive VP and negative VN charge pump output voltages. If the envelope detector provides separate indications of the positive and negative envelopes of the input signal, shown as VenvP and VenvN, the comparison voltages used for positive and negative charge pump output voltages may be controlled independently, and may no longer be balanced around ground, especially if the input signal 212 is asymmetric. In other words the actual bipolar output voltage may be asymmetric, at least for some time, even if the nominal bipolar voltage of the charge pump operating mode is symmetric.

Figure 20C:
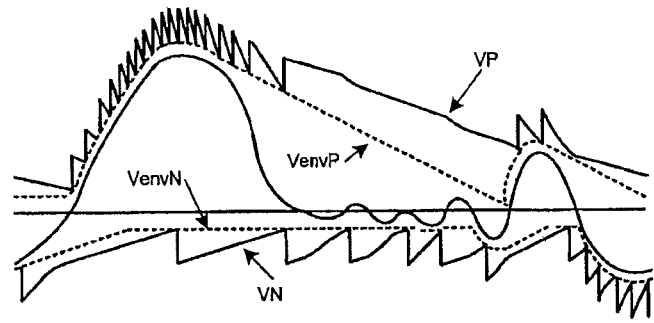
FIG. 20c shows an input signal waveform and corresponding envelope and charge pump output voltage waveforms.

FIG. 20c illustrates an input signal waveform and corresponding envelope and charge pump output voltage waveforms for such a case. The positive envelope VenvP follows the rapid positive ramp of the signal, but then decays only slowly after the peak until the next, smaller, peak arrives. The negative envelope VenvN decays to a preset minimum value until the signal goes appreciably negative. These envelopes are also displaced from the input signal by a preset headroom allowance. The charge pump output voltage VP jumps up as the reservoir capacitor CRP is recharged every time VP decays down to the envelope VenvP, before decaying back down to the envelope VenvP at a rate dependent on the signal amplitude, i.e. on the load current.

This decaying of the output voltage due to the discharging of a reservoir capacitor is what is termed "droop" of the output voltage, which term is also used to include any voltage difference from nominal caused by the on resistance of switches and similar effects.

Thus, there are frequent recharging events as VP is ramped positive, but relatively few as it ramps, or droops, negatively, particularly when the signal reduces to near zero or negative. (Even with a negative signal, some current may still be taken from CRP to power elements of the amplifier output stage). Similarly, CRN is only recharged frequently while the corresponding signal and envelope VenvN are ramping, or drooping, negatively.

At the maximum rate of recharging, the output voltage may rise close to the nominal output voltage for the set of states, i.e. mode, being employed. For instance this maximum charge pump output voltage might be +/−VV/2. To allow occasional bursts of larger signals, or to increase efficiency if the signal becomes small for a period, the available set of states, i.e. the basic mode of operation of the charge pump, may be altered, say according to control signal CPC based on a detected envelope. For instance a large envelope may cause a change of mode to one capable of generating +/−VV, or a small envelope may cause a change of mode to one only capable of generating at most +/−VV/4. In this case the operation of the charge pump would be affected by both fed forward and fed back control signals.

Thus the switch controller 206 may control the switch matrix 204, based on feedback via a comparison control signal or signals derived from a charge pump output voltage, so as to modulate operational parameters of the charge pump 202. Thus the switch controller 206 may control the switch matrix 204, based on a control signal fed forward via the charge pump controller 210 or on a control signal fed back via comparison from a charge pump output voltage. The switch controller 206 may control the switch matrix 204, based on fed back or fed forward control signal (including the possibility of using a combination of both), so as to modulate operational parameters of the charge pump 202.

The switch controller 206 may also control the switch matrix 204, based on a fed back or fed forward control signal, to change the size of some or all switches used to minimise supply droop at heavy loads while reducing the energy required for each switch transition at light loads. The effective switch size (proportional to total transistor width in the case of a MOS transistor switch) may be changed by activating or deactivating switching of parallel elements of a switch, for instance parallel segments of a MOS switch. FIG. 20*b* illustrates this possibility by showing the sequencer to have a logic input "As" to indicate whether large or small switches are desired, and two control wires, e.g. S1A and S1B controlling respective portions of each switch, e.g. MOS switch, S1. Normally S1A and S1B will both be driven with the same signal, activating both portions of S1 when required. But if the control logic 252 asserts input "As" of the sequencer, switch elements corresponding to S1B may be deactivated, thus decreasing the effective size of S1. The effective sizes of other switches, e.g. Sn, may be similarly controlled via similar pairs of control wires SnA and SnB. The size of all switches may be affected by the same input "As", or may be controlled separately via similar inputs, or the size of some switches may remain constant.

The switch controller 206 may also control the switch matrix 204, based on a fed back or fed forward control signal, to change the magnitude of a dither applied to the edges of the input clock which controls the clocking of the switching phases. The dither signal may be included so as to reduce spurious tones in the output at light loads, but preserve duty cycle and output impedance at heavy loads, where any such tones would tend to be randomised by the applied signal. The dithering may be controlled by a control signal output from the control logic to some circuitry in the clock chain generating the clock CLK used by the sequencer. The control logic may modulate the factor N by which the input clock CK is divided by the clock divider 254, or the dither may be generated by some more complex upstream circuitry (not illustrated), for instance to noise shape the dither spectrum by known techniques.

The output current of the charge pump 202 may also be monitored in order to modulate operational parameters of the charge pump, for example to change the switching frequency of the charge pump 202 according to load.

In one embodiment, if a high current is detected, indicating that a low impedance is connected, a headphone load may be deduced, in which case the volume should be restricted to avoid headphone or user overload and hence the output stage supply voltages (VP, VN) from the charge pump 202 can be reduced, or if only low currents are detected for a period of time, indicating connection of only a high impedance load, a line load can be assumed, in which case a maximum output swing is required to maximise signal-to-noise and consequently relatively high supply voltages are required to be output by the charge pump 202 while the output load current is relatively low, or the device may be assumed to be powered from the external peripheral or accessory to which the line output is connected, e.g. a docking station, so power efficiency is less important.

The current sense block may monitor the voltage drop across one or more switches, for example drain-source voltage of a MOS switch in the switch matrix 204. In the embodiment of FIG. 20*b*, signals VsnsP and VsnsP are shown emerging from the switch matrix, representing the voltages at each terminal of a MOS switch of the matrix. Their difference is then shown being compared by comparator 262 against a threshold signal to generate a corresponding logic signal for use by the control logic 252 to modulate the charge pump output voltage or other operational parameters.

The current may also be sensed by circuitry within the output driver amplifier. This may also be used perhaps for functions such as detecting a short to ground on the driver amplifier output. In this case, the sensed current, or a logic signal derived from it indicating excessive current may be transmitted to the charge pump control 210 instead of or in addition to the control logic 252. This is illustrated in FIG. 20*b* by the Output Condition Detect Signal input to the charge pump control. Such Output Condition Detect Signals may also be received from other sources, for example from a jack-detect contact on an output jack socket used to connect the driver amplifier to the load.

Figure 21:
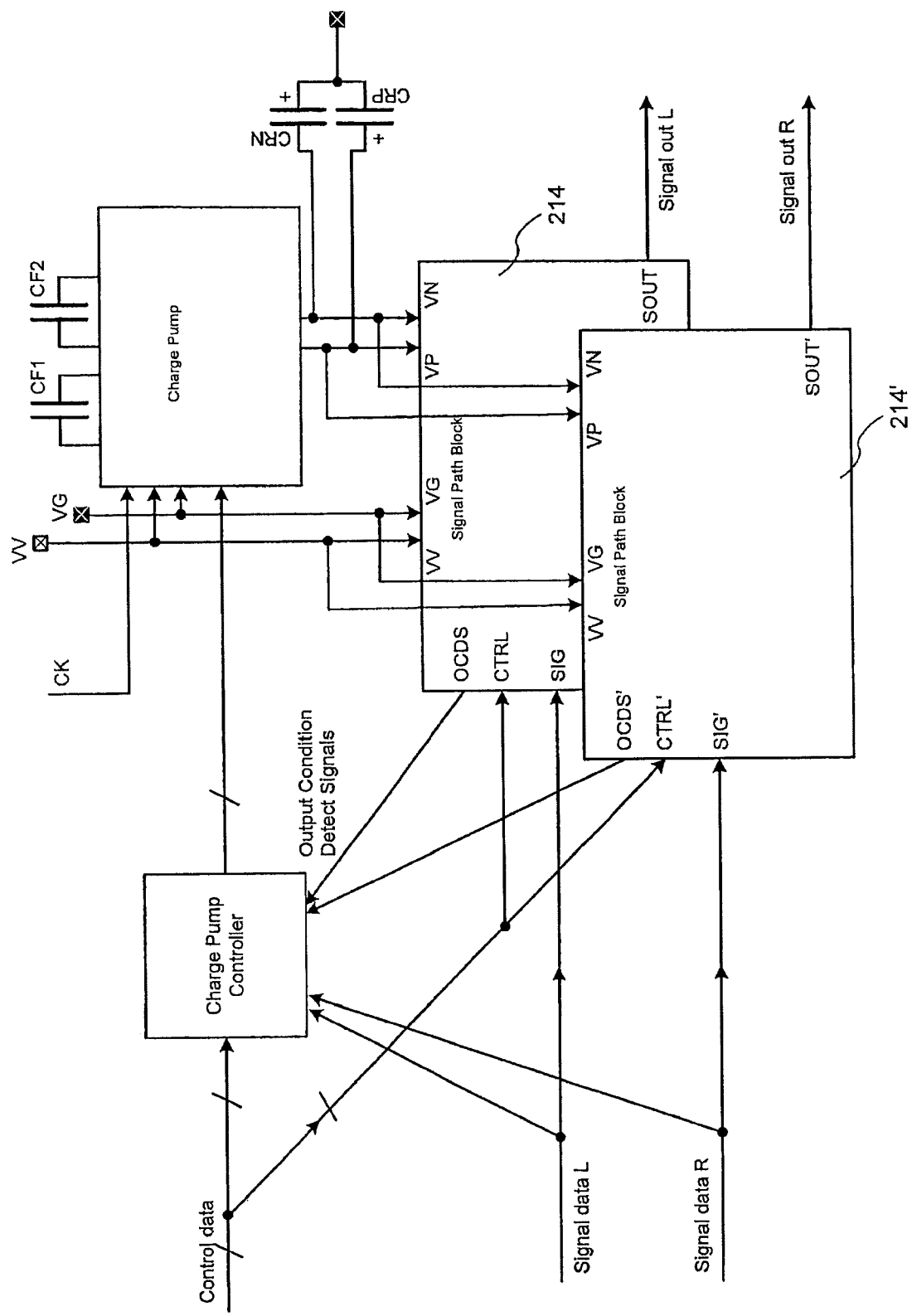

Although the system illustrated in FIG. 20*a* illustrates only a single output path from the signal path block 214, it should be understood, that the system of FIG. 20*a* could be adapted for a stereo output by providing an additional signal path block 214' as shown in FIG. 21, with appropriate controls. In practice, given the likely correlation between left and right channels, it is not worth the expense of supplying two charge pumps with independent outputs, so a common control corresponding to the heaviest demand would be applied to a shared charge pump. In general, multiple channels, for instance for surround sound formats such as 2.1, 5.1, or 7.1, may share a common charge pump with appropriate combination of the charge pump control signals.

As stated above, the control data supplied to charge pump control block 210 may comprise start-up/shut-down commands. These may be applied via switch controller 206 to alter the sequencing or duration of switching phases or the effective size or resistance (e.g. by modulating the gate drive voltage applied to a MOS switch) of switches used.

The control data may also comprise commands to ignore any envelope detection or volume control data and to directly control the settings of the switch controller 206, for example to set a fixed charge pump step-down ratio, perhaps during system start-up or to allow the envelope detector to be powered down if the output signal is otherwise known, for example a fixed amplitude tone. The control data may be derived from some sensor, perhaps a mechanical switch or some proximity detector that detects when a mobile device is connected to a docking station. The load may then by known to be a line load so preferably the output signal will be increased to maximise signal-to-noise, and in any case the device may be powered from the docking station so output stage efficiency is no longer so important. Thus the control data may be set by hardware or software to disable and ignore any envelope detection circuitry.

While FIG. 32b shows circuitry to enable all the various responses to fed-back signals, a particular embodiment would probably only require a subset of these, so the circuit could be simplified, for example by replacing the multiplexer and most of its reference voltage inputs by a simple hard-wired reference voltage connection.

Figure 22A:
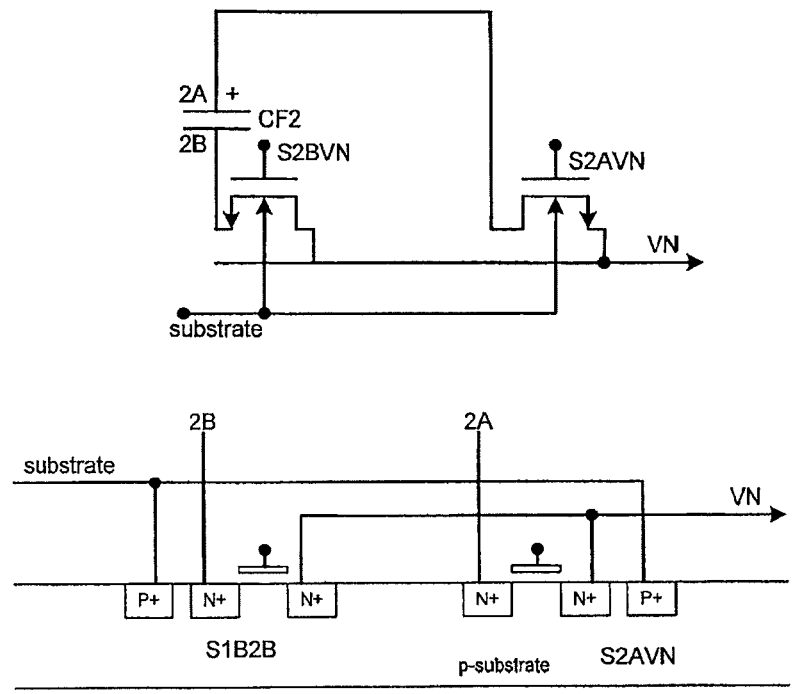
FIG. 22a shows a cross section and corresponding electrical circuit diagram of an NMOS switch.

The switching paths in the switch matrix 204 may be implemented as MOS switches. In particular, switching paths such as S2AVN and S2BVN may be implemented as NMOS switches. FIG. 22a shows a cross section of an NMOS switch.

In operation, the NMOS source, drain will be subject to negative voltages VN. If either of these voltages are more negative than the p substrate, the junction will forward bias, and clamp the node to a diode down from substrate voltage. There is also a possible latch-up and injection of charge into unexpected nodes e.g. via parasitic npn action. To avoid this, the substrate may be connected to the most negative voltage on the chip, probably VN. However this will alter the threshold voltage of every NMOS on the chip, changing as VN changes, and coupling any noise on VN across the chip. Also in some switching states (e.g. twelfth mode, state PT, FIG. 17a) node such as CF2B may actually be more negative than VN, so this node would need to pump the whole substrate negative in this phase.

Figure 22B:
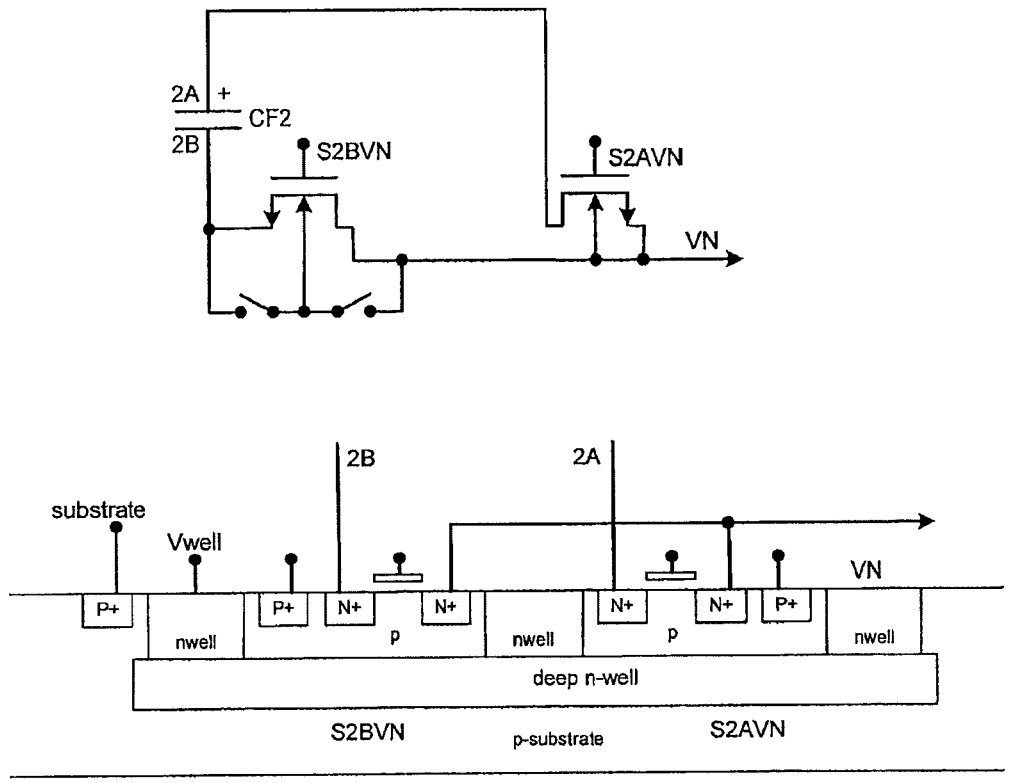
FIG. 22b shows a cross section and corresponding electrical circuit diagram of VN switches configured with respective body connections.

In order to avoid this, and to allow the substrate to be at ground for the rest of circuitry, the substrate under VN switches may be isolated using a deep-well (or "triple-well") option available on modern IC fabrication processes. FIG. 22b shows VN switches configured with respective body connections. The lateral n-well and underlying deep n-well implants isolate these regions. If Vwell is the most positive potential on the chip, then the junctions to these n-wells cannot end up forward biased.

For S2AVN, the NMOS body may be hard-wired to VN, since 2A never goes below VN. However S2BVN presents more difficulty. Considering operation in the twelfth mode for example, in state PT, node 2B is 2*VV/6 more negative than VN, in other phases it is more positive than VN: additional switches need to be added to switch the body of S2BVN to source or drain, depending which is more negative. These may be controlled by means of extra lines form the switch controller per phase, though it is possible to implement circuitry that compares the two node voltages and switches the body to the more autonomously.

Figure 22C:
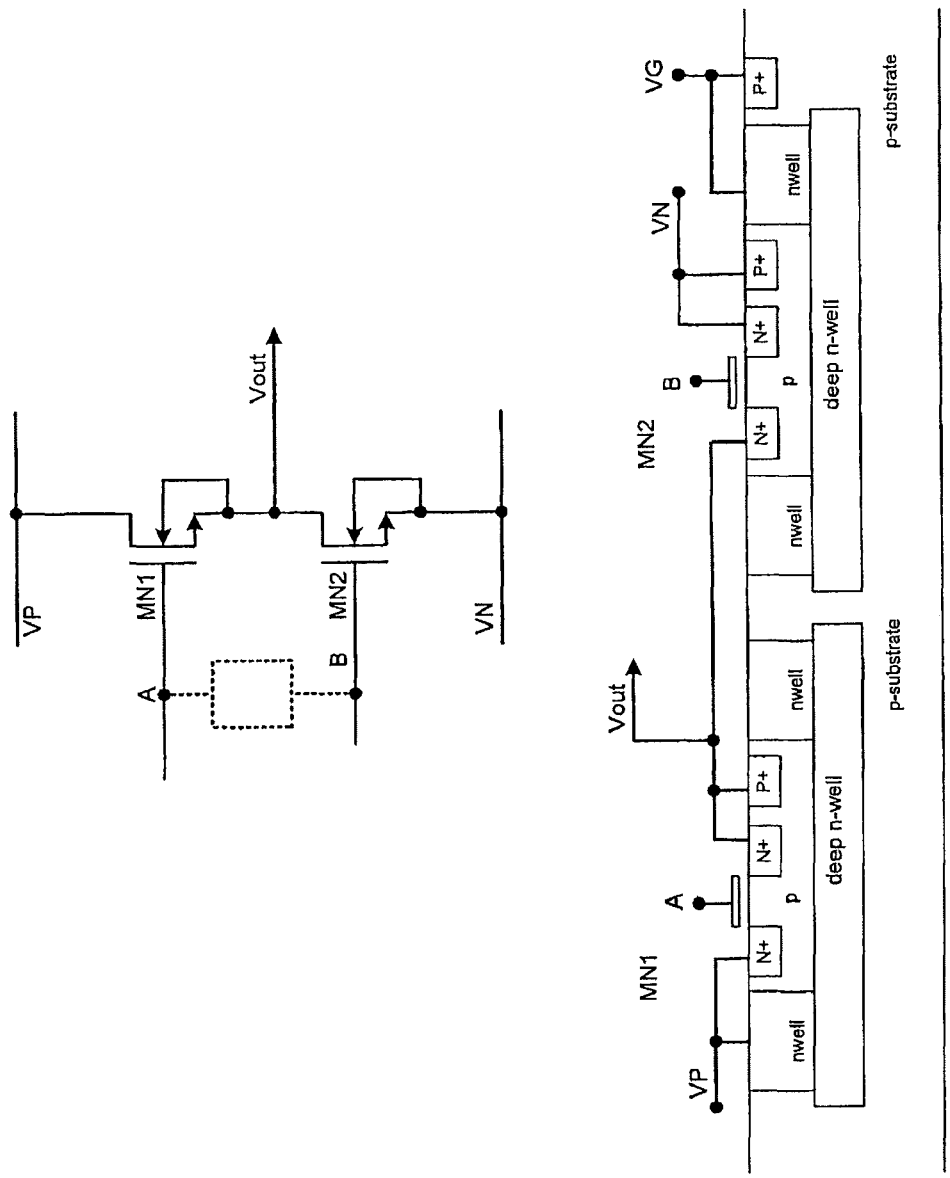
FIG. 22c shows a cross section and corresponding electrical circuit diagram of an NMOS output stage.

Similarly, there may also be NMOS inside the amplifiers powered from VN that will need similar NMOS body connections. FIG. 22c shows an NMOS output stage. If VB is constant then this is a Class A source follower; or MN2 gate voltage may be modulated by the input signal on A to implement a Class AB output stage. In this case, the p-body of MN2 is biased at VN, so the surrounding n-well may be biased at ground without risk of forward biasing. However, the p-body of MN1 is connected to Vout, which may be pulled up near to VP, so the n-well surrounding this p-body needs to be biased to VP (or higher).

Figure 22D:
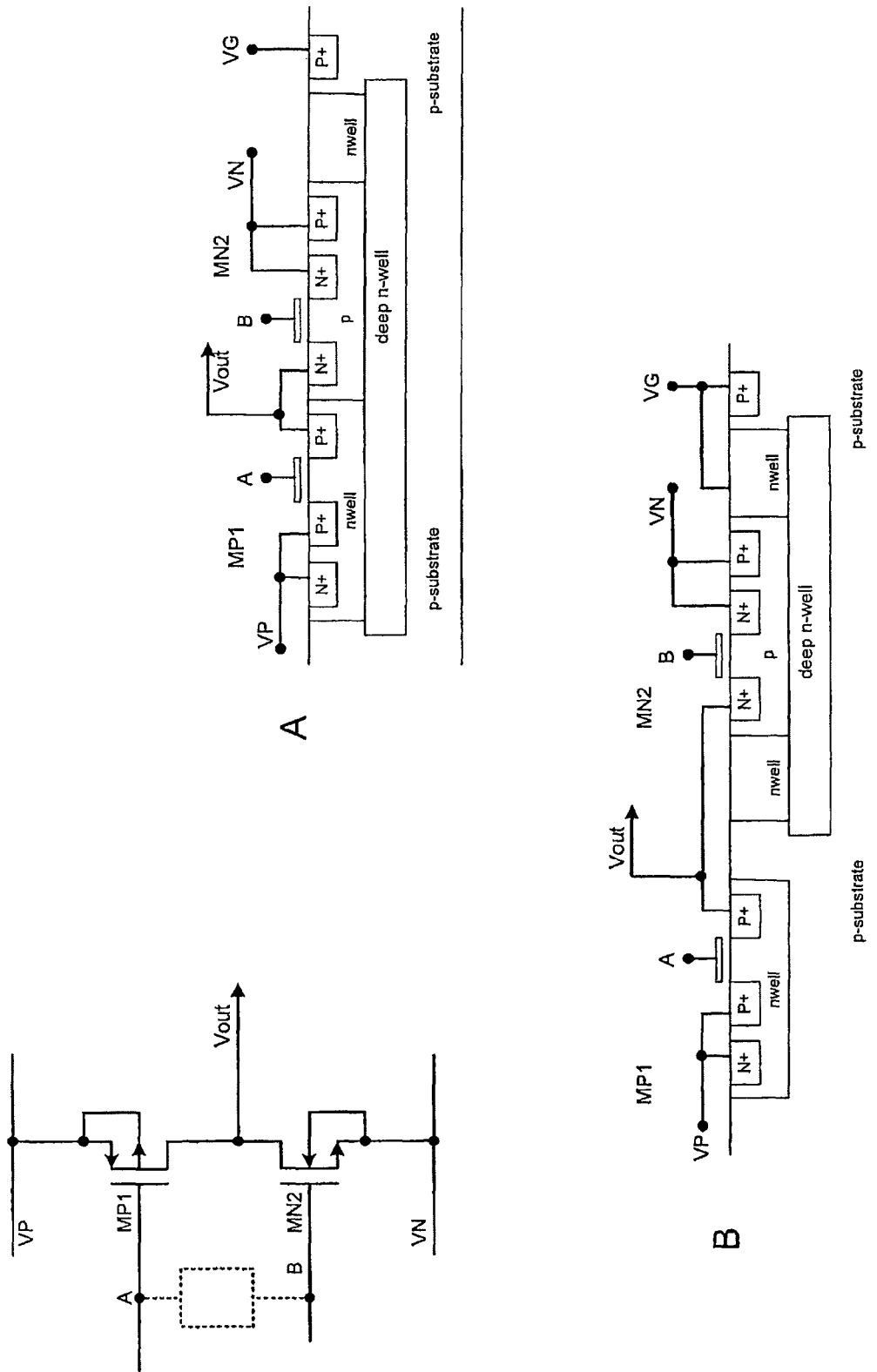
FIG. 22d shows two alternative cross sections A and B and a corresponding electrical circuit diagram of a CMOS output stage.

FIG. 22d shows a CMOS output stage, again possibly with linkage between A and B to give a Class AB output stage. The PMOS well may be merged with the isolating n-well (see figure labelled A) if both are connected to VP, or be separate if MN2 isolating well is connected to e.g. VG. (see figure labelled B)

The above description refers generally to switching paths, it should be understood that each switching path may contain a single switch. Alternatively, each switching path may contain any number of discrete switches as is desired to manage voltage stresses efficiently across each switching path.

The circuits of the charge pump may be controlled by hard-wired logic. But with cheaper, faster processing becoming available, it may be desirable to implement some functions, for example the envelope detection, in general purpose DSP hardware loaded with appropriate software algorithms.

The switching paths may use alternative switching structures, such as MEMS relays for example.

It may be convenient for physical layout reasons or for supply noise management reasons to provide more than one physical terminal (for example package pin, lead, or solder ball) for the input supply and the ground, or possibly the charge pump output nodes, where in use the terminals in question are connected together on an underlying substrate or printed circuit board. These terminals would then constitute a single node. In some cases, the connection may be some distance away from the integrated circuit, to provide a star ground connection point for a printed circuit board, but would still constitute a single node.

The above described embodiments use two flying capacitors and associated switch matrices or networks of switches. In further embodiments, the charge pump as described may constitute part of a larger network of switches or use more than two flying capacitors, for example to generate yet further voltages. However if these additional switching paths or flying capacitors were removed, the remaining circuitry could still be operable as described in the above embodiments.

The polarities of voltages an capacitors and outputs in the embodiments described above have assumed a positive input supply voltage VV (or VW) is applied to the charge pump. Equivalent circuits and operation is possible with a negative input supply voltage with consequent adjustments to the polarities of voltages.

In summary, embodiments of the present invention provide a pair of bipolar output voltages from a charge pump, the charge pump being a low power, low cost charge pump that is particularly suitable for battery-powered devices. The described embodiments are also applicable for higher-power amplifiers, where reduced power dissipation on drivers rather than consumption is issue, and the elimination, or at least the minimization, of audio artefacts is critical.

Although the above describes the invention in relation to audio amplifiers, as will be apparent to the skilled person, the invention is also applicable to other systems, especially those driving appreciable loads with signals of similar frequencies, e.g. haptic transducer driving and ultrasonic drivers.

What is claimed is:

1. A charge pump circuit operable to output a bipolar output voltage, comprising:
at least one input node configured to receive an input voltage;
a first output node and a second output node configured to output the bipolar output voltage;
flying capacitor nodes configured for connection of a plurality of flying capacitors;

a network of switching paths for interconnecting said nodes; and a switch controller operable in at least a first mode to control the network of switching paths, when in use with two flying capacitors connected to the flying capacitor nodes and with first and second reservoir capacitors connected to the first and second output nodes respectively, to repeatedly charge the first and second reservoir capacitors to provide a first nominal bipolar output voltage, wherein the first nominal bipolar output voltage is one of ±3VV, ±2VV, ±VV/3, ±VV/4, ±VV/5 or ±VV/6, where VV is the input voltage;

wherein the switch controller is operable such that a frequency of charging the first and second reservoir capacitors in said first mode is variable from a first maximum frequency to at least a second lower frequency.

2. The charge pump circuit of claim 1 wherein the switch controller is operable such that the frequency of charging the first reservoir capacitor can be different to the frequency of charging the second reservoir capacitor.

3. The charge pump circuit of claim 1 wherein the switch controller is configured to controllably vary the frequency of charging the first and second reservoir capacitors based on at least one control signal.

4. The charge pump circuit of claim 3 wherein said at least one control signal comprises at least one feedback signal derived from the bipolar output voltage.

5. The charge pump circuit of claim 4 further comprising at least one comparator for comparing a voltage at one of the first or second output nodes or a difference voltage between the first and second output nodes with a threshold to provide said at least one feedback signal.

6. The charge pump circuit of claim 5 wherein said threshold is independent of the input voltage.

7. The charge pump circuit of claim 1 wherein said at least one control signal comprises a signal indicative of a load demand of a load connected to the first and second output node.

8. The charge pump circuit of claim 7 wherein the load is an amplifier and the signal indicative of a load demand is an indication of a signal level of an input signal to the amplifier.

9. The charge pump circuit of claim 1 wherein the switch network comprises at least a first switch formed on a first region of semiconductor substrate where the first region is isolated from the rest of the substrate by one or more n-well regions.

10. The charge pump circuit of claim 1 wherein the switch controller is further operable in at least a second mode to control the network of switching paths to provide a second nominal bipolar output voltage which is different to the first nominal bipolar output voltage.

11. The charge pump circuit of claim 10 wherein the second nominal bipolar output voltage is of one of ±3VV, ±2VV, ±VV, ±VV/2, ±VV/3, ±VV/4, ±VV/5 or ±VV/6.

12. The charge pump circuit of claim 10 wherein the switch controller is further operable in at least a third mode to control the network of switching paths to provide a third nominal bipolar output voltage, and where the first nominal bipolar output voltage is ±VV/3, the second nominal bipolar output voltage is ±VV/2 and the third nominal bipolar output voltage is ±VV.

13. The charge pump circuit of claim 10 wherein the charge pump circuit is configured as part of an audio output circuit comprising an amplifier, wherein the bipolar output voltage is provided as a supply voltage for said amplifier.

14. The charge pump circuit of claim 13 further comprising a charge pump controller operable to control the switch controller to operate in a selected operating mode based on at least one characteristic of an audio signal to be amplified by said audio circuit.

15. The charge pump circuit of claim 14 wherein the charge pump controller comprises an envelope detector for determining an envelope value for the audio signal and the charge pump controller operable to control the switch controller to operate in a selected operating mode based on said envelope value.

16. The charge pump circuit of claim 13 further comprising a charge pump controller operable to control the switch controller to operate in a selected operating mode based on an impedance of an audio load to be driven by the amplifier.

17. The charge pump circuit of claim 13 wherein the audio output circuit comprises a headphone driver circuit.

18. An electronic device comprising the charge pump circuit of claim 1.

19. A charge pump circuit operable to output a bipolar output voltage, comprising:

at least one input node configured to receive an input voltage;

first and second output nodes for outputting the bipolar output voltage;

flying capacitor nodes configured for connection to at least first and second flying capacitors;

a network of switching paths for interconnecting said nodes; and a switch controller operable in at least a first mode to control the network of switching paths, when in use with first and second reservoir capacitors connected to the first and second output nodes respectively, to repeatedly charge the first and second reservoir capacitors to provide a bipolar output voltage, wherein the bipolar output voltage is one of ±3VV, ±2VV, ±VV/3, ±VV/4, ±VV/5 or ±VV/6, where VV is the input voltage;

wherein the switch controller is operable to controllably vary a frequency of charging the first and second reservoir capacitors up to a maximum frequency.

20. A charge pump circuit for receiving a voltage input and outputting a bipolar output voltage, the charge pump circuit comprising:

output nodes for outputting the bipolar output voltage, the output nodes being connected, in use, to first and second reservoir capacitors;

flying capacitor nodes for connection to a plurality of flying capacitors;

a switch network comprising a plurality of switches;

a switch controller for selectively controlling said switches in a sequence of switch states to generate the bipolar output voltage, wherein the bipolar output voltage is one of ±3VV, ±2VV, ±VV/3, ±VV/4, ±VV/5 or ±VV/6, where VV is the input voltage and wherein the switch controller is operable such that a frequency of charging of the first and second reservoir capacitors is controllably variable in use, and wherein the switch network comprises at least a first switch formed on a first region of semiconductor substrate where the first region is isolated from the rest of the substrate by one or more n-well regions.

* * * * *